(12) United States Patent
Li et al.

(10) Patent No.: US 9,705,051 B2
(45) Date of Patent: Jul. 11, 2017

(54) LIGHT EMITTING DEVICE

(71) Applicant: PlayNitride Inc., Tainan (TW)

(72) Inventors: Yun-Li Li, Tainan (TW); Po-Jen Su, Tainan (TW); Hsuan-Wei Mai, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/924,719

(22) Filed: Oct. 28, 2015

(65) Prior Publication Data

US 2016/0141467 A1 May 19, 2016

Related U.S. Application Data

(60) Provisional application No. 62/081,503, filed on Nov. 18, 2014, provisional application No. 62/092,265, filed on Dec. 16, 2014.

(30) Foreign Application Priority Data

May 11, 2015 (TW) .............................. 104114841 A

(51) Int. Cl.
*H01L 33/50* (2010.01)
*H01L 33/44* (2010.01)
(Continued)

(52) U.S. Cl.
CPC .......... *H01L 33/505* (2013.01); *H01L 33/504* (2013.01); *H01L 33/382* (2013.01); *H01L 33/44* (2013.01); *H01L 33/62* (2013.01)

(58) Field of Classification Search
CPC ..... H01L 33/505; H01L 33/44; H01L 33/504; H01L 33/62
See application file for complete search history.

(56) References Cited

U.S. PATENT DOCUMENTS

2006/0091409 A1 5/2006 Epler et al.
2009/0309116 A1* 12/2009 Kato .................. C09K 11/7721
257/98
(Continued)

FOREIGN PATENT DOCUMENTS

TW 201102694 1/2011
TW 201119092 6/2011

OTHER PUBLICATIONS

"Office Action of Taiwan Counterpart Application", issued on Jul. 18, 2016, p. 1-p. 9.

*Primary Examiner* — Fernando L Toledo
*Assistant Examiner* — Neil Prasad
(74) *Attorney, Agent, or Firm* — Jianq Chyun IP Office

(57) ABSTRACT

A light emitting device includes an epitaxial structure and a sheet-shaped wavelength converting layer. The sheet-shaped wavelength converting layer is disposed on the epitaxial structure and at least includes a first wavelength converting unit layer and a second wavelength converting unit layer. The first wavelength converting unit layer is disposed between the second wavelength converting unit layer and the epitaxial structure. An emission peak wavelength of the first wavelength converting unit layer is greater than an emission peak wavelength of the second wavelength converting unit layer. A full width half magnitude of the second wavelength converting unit layer is greater than a full width half magnitude of the first wavelength converting unit layer.

17 Claims, 18 Drawing Sheets

(51) Int. Cl.
H01L 33/62 (2010.01)
H01L 33/38 (2010.01)

(56) References Cited

U.S. PATENT DOCUMENTS

| | | | |
|---|---|---|---|
| 2011/0006334 A1* | 1/2011 | Ishii | C09K 11/584 |
| | | | 257/98 |
| 2011/0156002 A1* | 6/2011 | Leatherdale | H01L 33/08 |
| | | | 257/13 |
| 2012/0032578 A1* | 2/2012 | Annen | B82Y 30/00 |
| | | | 313/483 |
| 2014/0319560 A1 | 10/2014 | Tischler | |
| 2015/0014725 A1* | 1/2015 | Hong | C09K 11/7721 |
| | | | 257/98 |
| 2015/0097208 A1* | 4/2015 | Sugizaki | H01L 24/19 |
| | | | 257/99 |

* cited by examiner

LIGHT EMITTING DEVICE

CROSS-REFERENCE TO RELATED APPLICATION

This application claims the priority benefit of U.S. provisional application Ser. No. 62/081,503, filed on Nov. 18, 2014, U.S. provisional application Ser. No. 62/092,265, filed on Dec. 16, 2014, and Taiwan application serial no. 104114841, filed on May 11, 2015. The entirety of each of the above-mentioned patent applications is hereby incorporated by reference herein and made a part of this specification.

BACKGROUND OF THE INVENTION

1. Field of the Invention

The invention relates to a semiconductor device, and particularly relates to a light emitting device.

2. Description of Related Art

In the conventional light emitting diode device, a light emitting diode chip is placed on a carrier, and then a packaging gel is formed on the light emitting chip through adhesive dripping. Thus, the appearance of the conventional light emitting diode device shows a hemispherical profile, and the light emitting diode device thus has a greater width (i.e., a width of a carrier plate) and a greater height (i.e., the curve-shaped packaging gel). In other words, the light emitting diode device has a larger volume, and does not meet the needs for miniaturizing devices nowadays. Besides, in the light emitting diode device, phosphorous particles may be added to the packaging gel for the light emitting diode device to emit light with different colors. However, due to the effect of gravity, the phosphorous particles in the packaging gel may be precipitated onto the light emitting diode chip before the packaging gel is fully solidified, making the phosphorous particles distributed in the packaging gel unevenly. Accordingly, the packaged light emitting diode device may emit light unevenly, making it unable to effectively improve a light emitting efficiency and a color rendering property thereof.

SUMMARY OF THE INVENTION

The invention provides a light emitting device having a smaller volume and preferable light emitting efficiency and color rendering property.

A light emitting device of the invention includes an epitaxial structure and a sheet-shaped wavelength converting layer. The sheet-shaped wavelength converting layer is disposed on the epitaxial structure, and at least includes a first wavelength converting unit layer and a second wavelength converting unit layer. The first wavelength converting unit layer is located between the second wavelength converting unit layer and the epitaxial structure. An emission peak wavelength of the first wavelength converting unit layer is greater than an emission peak wavelength of the second wavelength converting unit layer, and a full width half magnitude (FWHM) of the second wavelength converting unit layer is greater than a full width half magnitude of the first wavelength converting unit layer.

According to an embodiment of the invention, the first wavelength converting unit layer includes a wavelength converting substance and a gel, the first wavelength converting unit layer is calculated based on total percentage of 100% of composition, the wavelength converting substance has a percentage by weight in a range from 60% to 95%, and a thickness of the first wavelength converting unit layer is in a range from 1.2 times to 3 times of a mean particle diameter of the wavelength converting substance.

According to an embodiment of the present invention, the sheet-shaped wavelength converting layer further includes a third wavelength converting unit layer. The third wavelength converting unit layer is disposed between the first wavelength converting unit layer and the second wavelength converting unit layer. In addition, an emission peak wavelength of the third wavelength converting unit layer is smaller than the emission peak wavelength of the first wavelength converting unit layer, and the emission peak wavelength of the third wavelength converting unit layer is greater than the emission peak wavelength of the second wavelength converting unit layer.

According to an embodiment of the invention, a full width half magnitude of the third wavelength converting unit layer is smaller than the full width half magnitude of the second wavelength converting unit layer, and the full width half magnitude of the third wavelength converting unit layer is greater than the full width half magnitude of the first wavelength converting unit layer.

According to an embodiment of the invention, a thickness of the first wavelength converting unit layer is smaller than a thickness of the second wavelength converting unit layer.

According to an embodiment, the light emitting device further includes an adhesive layer. The adhesive layer is disposed between the first wavelength converting unit layer and the second wavelength converting unit layer, and a thickness of the adhesive layer is in a range from 0.3 times to 0.7 times of a thickness of the first wavelength converting unit layer.

According to an embodiment of the invention, a Shore Durometer Hardness of the sheet-shaped wavelength converting layer is in a range from Shore D 30 to Shore D 90.

According to an embodiment of the invention, the light emitting device further includes a substrate and an electrode connecting layer. The substrate has an upper surface and a lower surface opposite to each other and has a plurality of conductive through vias penetrating the substrate and connecting the upper surface and the lower surface. The electrode connecting layer is disposed on the upper surface of the substrate and electrically connected to the conductive through vias. There is at least one space between each of the conductive through vias and the electrode connecting layer, and the electrode connecting layer has a connecting layer, at least one first electrode, and at least one second electrode. The first electrode and the second electrode are separated from each other and connected to the connecting layer, and the connecting layer has at least one buffer region exposing the upper surface of the substrate. The epitaxial structure is disposed on the electrode connecting layer and electrically connected with the electrode connecting layer.

According to an embodiment of the invention, an edge of the sheet-shaped wavelength converting layer is aligned with an edge of the substrate.

According to an embodiment of the invention, an edge of the electrode connecting layer is aligned with an edge of the substrate.

According to an embodiment of the invention, the epitaxial structure has a rough surface, and there are micrometer-level voids between the rough surface and the sheet-shaped wavelength converting layer.

According to an embodiment, the light emitting device further includes an optical coupling layer. The optical coupling layer is disposed between the sheet-shaped wavelength converting layer and the epitaxial structure. Moreover, the optical coupling layer has a rough surface, and there are micrometer-level voids between the rough surface and the sheet-shaped wavelength converting layer or between the rough surface and the epitaxial structure.

According to an embodiment, the light emitting device further includes a color mixing layer. The color mixing layer is disposed on the sheet-shaped wavelength converting layer. In addition, an edge of the color mixing layer is aligned with an edge of the sheet-shaped wavelength converting layer, and a thickness of the color mixing layer is in a range from three times to six times of a thickness of the first wavelength converting unit layer.

According to an embodiment, the light emitting device further includes an insulating layer. The insulating layer is disposed on the electrode connecting layer and insulates the first electrode and the second electrode. The epitaxial structure includes a first type semiconductor layer, a light emitting layer, and a second type semiconductor layer. The first type semiconductor layer is disposed on the insulating layer. The first electrode penetrates the insulating layer to be electrically connected with the first type semiconductor layer. The light emitting layer is disposed on the first type semiconductor layer. The second type semiconductor layer is disposed on the light emitting layer. Also, the second electrode penetrates the insulating layer, the first type semiconductor layer, and the light emitting layer to be electrically connected with the second type semiconductor layer.

According to an embodiment, the light emitting device further includes an insulating protection layer. The insulating protection layer covers an edge of the first type semiconductor layer, an edge of the light emitting layer, and an edge of the second type semiconductor layer. In addition, an edge of the insulating protection layer is aligned with an edge of the substrate.

According to an embodiment, the light emitting device further includes a plurality electrode pads. The electrode pads are disposed on the upper surface of the substrate and connected to the conductive through vias and the electrode connecting layer. In addition, an orthogonal projection of the electrode pads on the substrate completely overlaps an orthogonal projection of the connecting layer on the substrate and projection areas thereof are the same.

According to an embodiment, the light emitting device further includes a plurality pads. The pads are disposed on the lower surface of the substrate and connected to the conductive through vias. Moreover, a distance between the pads is greater than a distance between the electrode pads.

Based on above, the sheet-shaped wavelength converting layer of the invention at least includes the first wavelength converting unit layer and the second wavelength converting unit layer. In addition, the emission peak wavelength of the first wavelength converting unit layer is greater than the emission peak wavelength of the second wavelength converting unit layer, and the full width half magnitude of the second wavelength converting unit layer is greater than the full width half magnitude of the first wavelength converting unit layer. In such arrangement where the emission wavelengths are arranged from one with a longer wavelength to one with a shorter wavelength, since the energy of the emitted light of the first wavelength converting unit layer is lower, the emitted light of the first wavelength converting unit layer is not absorbed by the second wavelength converting unit layer. Moreover, since the full width magnitudes are arranged from one with a smaller full width magnitude to one with a greater full width magnitude, the wavelength of the emitted light of the first wavelength converting unit layer may be prevented from overlapping the absorbing wave band of the second wavelength converting unit layer. In this way, the light emitting device has a wider wave band coverage after light mixture, thereby having a more preferable light emitting efficiency and color rendering property.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
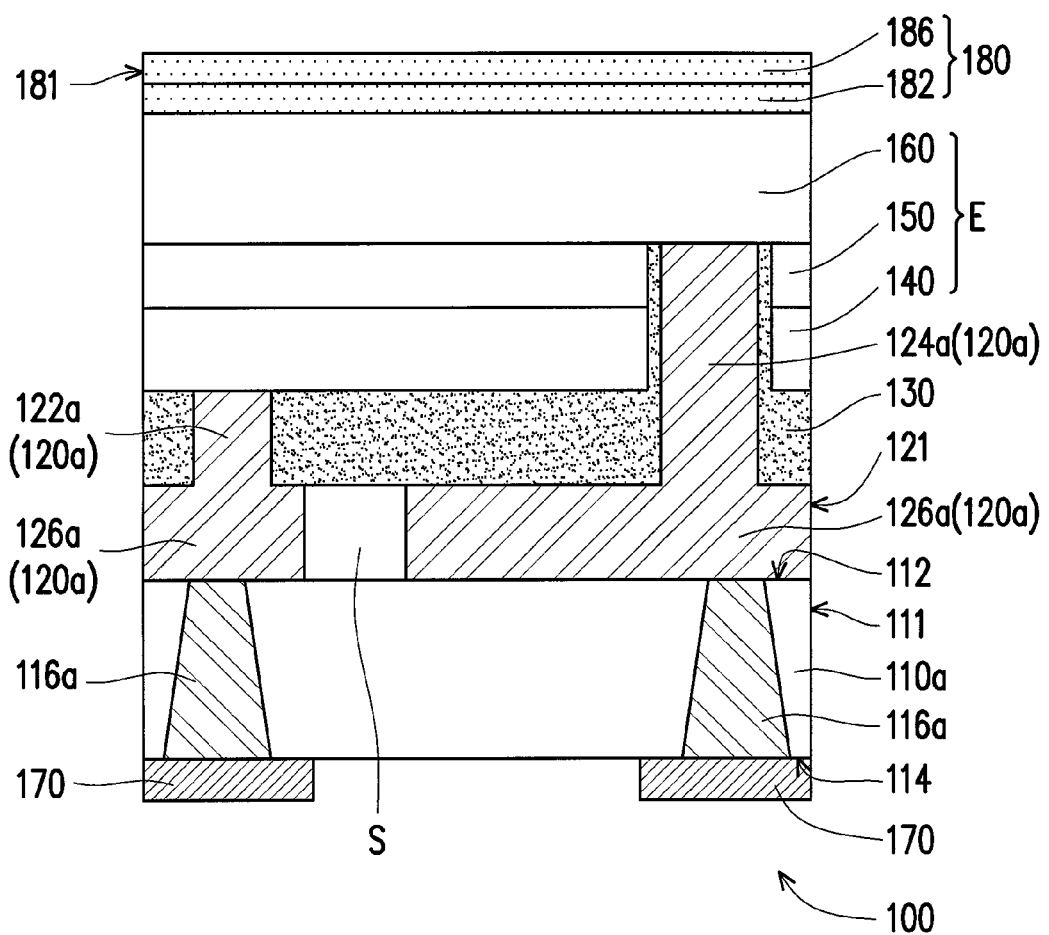
FIG. 1A is a cross-sectional schematic view illustrating a light emitting device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A is a cross-sectional schematic view illustrating a light emitting device according to an embodiment of the invention. Referring to FIG. 1A, in this embodiment, a light emitting device 100 includes an epitaxial structure E and a sheet-shaped wavelength converting layer 180. Specifically, the sheet-shaped wavelength converting layer 180 is disposed on the epitaxial structure E, and at least includes a first wavelength converting unit layer 182 and a second wavelength converting unit layer 186. In addition, the first wavelength converting unit layer 182 is located between the second wavelength converting unit layer 186 and the epitaxial structure E. An emission peak wavelength of the first wavelength converting unit layer 182 is greater than an emission peak wavelength of the second wavelength converting unit layer 186, and a full width half magnitude of the second wavelength converting unit layer 186 is greater than a full width half magnitude of the first wavelength converting unit layer 182.

Figure 1B:
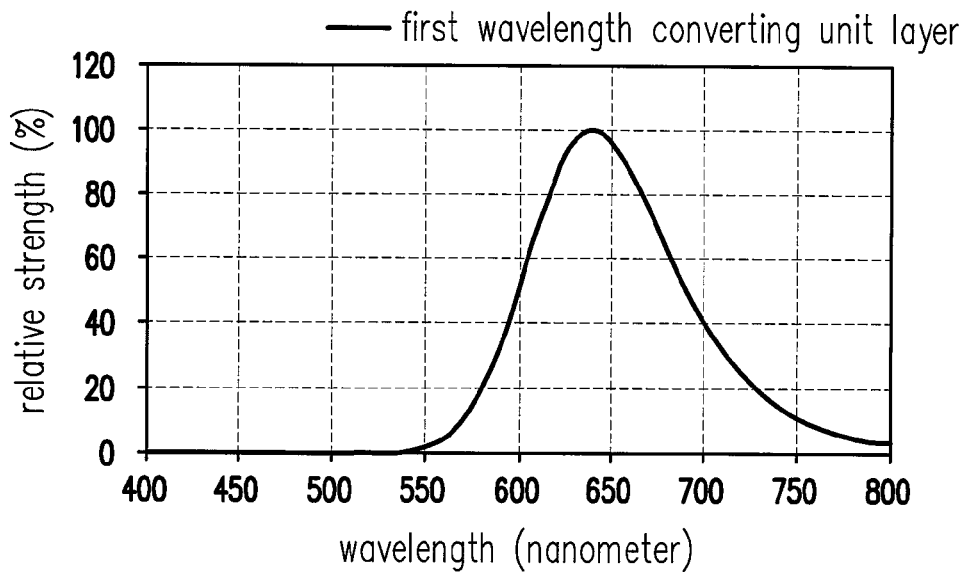
FIGS. 1B(a) and 1B(b) are respectively emission spectrum diagrams of a first wavelength converting unit layer and a second wavelength converting unit layer according to an embodiment of the invention.
Figure 1B:
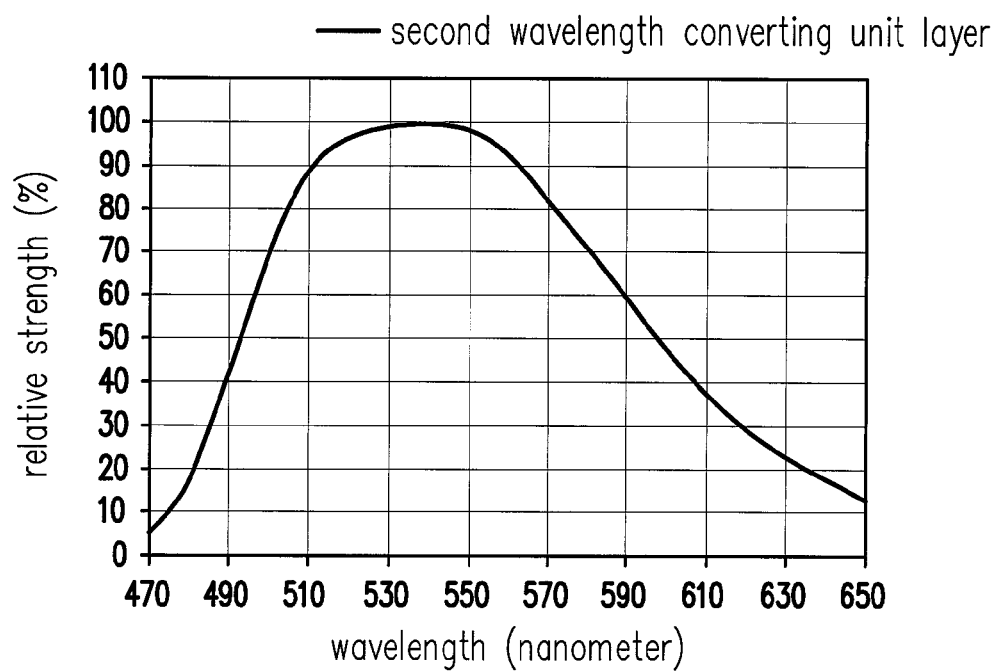

More specifically, referring to FIGS. 1B(a) and 1B(b), when the epitaxial structure E emits blue light, for example, the second wavelength converting unit layer 186 is a green light wavelength converting unit layer, for example, having a emission peak wavelength with a wavelength in a range from 470 nanometers to 560 nanometers and having a full width half magnitude in a range from 80 nanometers to 120 nanometers, and the first wavelength converting unit layer 182 is a red light wavelength converting unit layer, for example, having a emission peak wavelength with a wavelength in a range from 600 nanometers to 700 nanometers and having a full width half magnitude in a range from 50 nanometers to 100 nanometers. The emission peak wavelength of the first wavelength converting unit layer 182 is greater than the emission peak wavelength of the second wavelength converting unit layer 186. In such arrangement where the emission wavelengths are arranged from one with a longer wavelength to one with a shorter wavelength, since an energy of emitted light of the first wavelength converting unit layer 182 is lower, the emitted light of the first wavelength converting unit layer 182 is not absorbed by the second wavelength converting unit layer 186. Moreover, since the full width magnitudes are arranged from one with a smaller full width magnitude to one with a greater full width magnitude, a wavelength of the emitted light of the first wavelength converting unit layer 182 may be prevented from overlapping an absorbing wave band of the second wavelength converting unit layer 186. In this way, the light emitting device 100 has a wider wave band coverage after light mixture, thereby having a more preferable color rendering property.

Moreover, the first wavelength converting unit layer 182 of this embodiment is formed of a wavelength converting substance and a gel (not shown). If the first wavelength converting unit layer 182 is calculated based on total percentage of 100% of composition, the wavelength converting substance has a percentage by weight in a range from 60% to 95%, and a thickness of the first wavelength converting unit layer 182 is in a range from 1.2 times to 3 times of a mean particle diameter of the wavelength converting substance. With a formula having a high concentration of the wavelength converting substance, a solid content in a wavelength converting gel may be increased and the thickness of the first wavelength converting unit layer 182 may be reduced. Thus, heat generated during wavelength conversion may not be easily accumulated in the first wavelength converting unit layer 182. Here, a thickness and proportions of composition of the second wavelength converting unit layer 186 may follow those of the first wavelength converting unit layer 182.

Figure 1C:
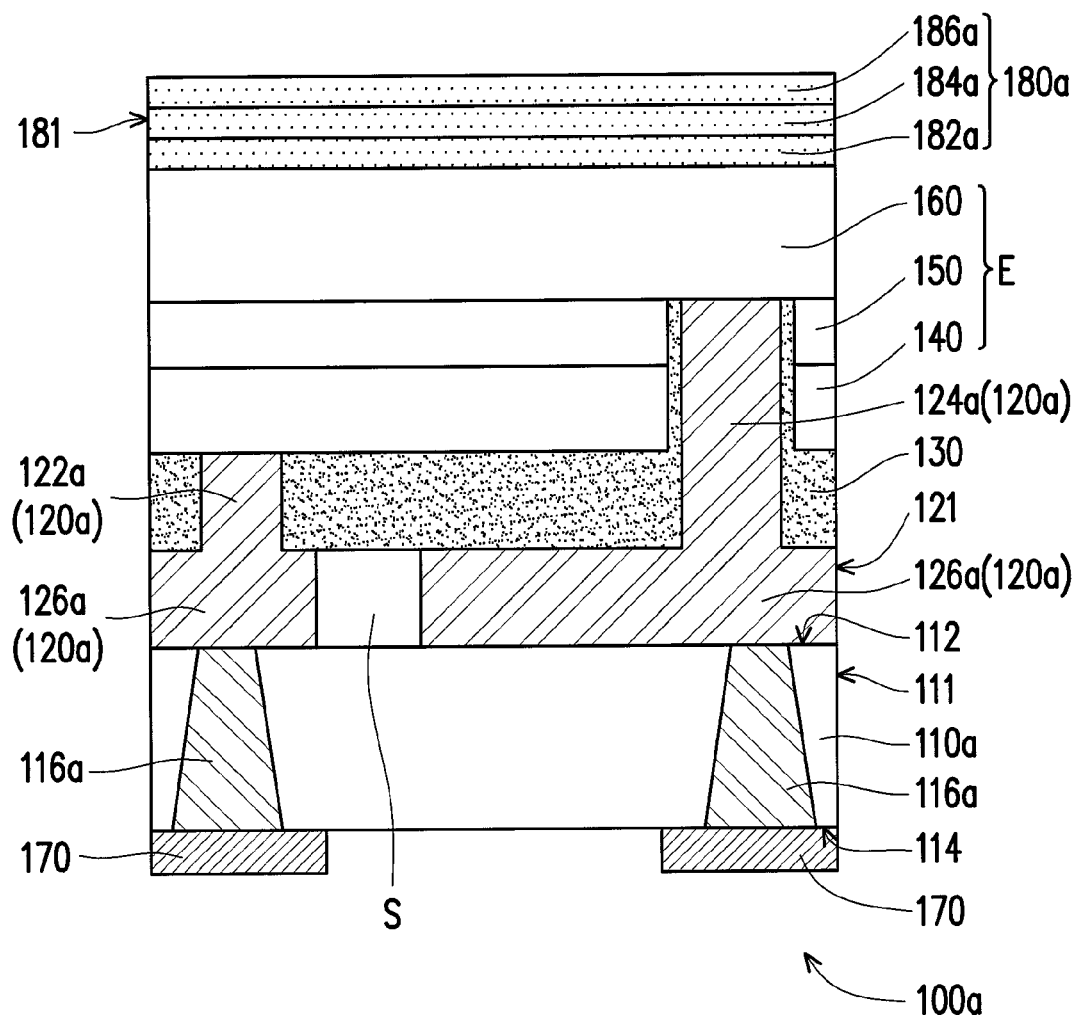
FIG. 1C is a cross-sectional schematic view illustrating a light emitting device according to another embodiment of the invention.

It should be noted that, in other embodiments such as the embodiment shown in FIG. 1C, a light emitting device 100a may further include a third wavelength converting unit layer 184a disposed between a first wavelength converting unit layer 182a and a second wavelength converting unit layer 186a. An emission peak wavelength of the third wavelength converting unit layer 184a is smaller than an emission peak wavelength of the first wavelength converting unit layer 182a, yet greater than an emission peak wavelength of the second wavelength converting unit layer 186a. A full width half magnitude of the third wavelength converting unit layer 184a is smaller than a full width half magnitude of the second wavelength converting unit layer 186a, yet greater than a full width half magnitude of the first wavelength converting unit layer 182a.

More specifically, the third wavelength converting unit layer 184a may be a yellow wavelength converting unit layer, for example, having an emission peak wavelength with a wavelength in a range from 550 nanometers to 600 nanometers. Such arrangement prevents light converted by the first wavelength converting unit layer 182a having the longest emission peak wavelength from being absorbed by the third wavelength converting unit layer 184a having the second longest emission peak wavelength and the second wavelength converting unit layer 186a having the shortest emission peak wavelength, makes the light emitting device 100a has a preferable light emitting efficiency, and retains peak wavelengths of at least three regions of different wavelengths, thereby allowing the light emitting device 100a of the invention to have a more preferable color rendering property. Of course, in other embodiments, the first wavelength converting unit layer 182a, the second wavelength converting unit layer 186a, and the third wavelength converting unit layer 184a may also be wavelength converting unit layers of other colors. The invention does not intend to limit the colors of the wavelength converting unit layers. Here, a thickness of each of the first, third, and second wavelength converting unit layers 182a, 184a, and 186a are in a range from 5 micrometers to 80 micrometers, for example, and is preferably in a range from 20 micrometers to 60 micrometers.

More specifically, in FIGS. 1A and 1C, the light emitting devices 100 and 100a further include a substrate 110a, an electrode connecting layer 120a, and a plurality of pads 170. Specifically, the substrate 110a has an upper surface 112 and a lower surface 114 opposite to each other and a plurality of conductive through vias 116a penetrating the substrate 110a and connecting the upper surface 112 and the lower surface 114. The electrode connecting layer 120a is disposed in the upper surface 112 of the substrate 110 and electrically connected to the conductive through vias 116a. In addition, the electrode connecting layer 120a includes at least one first electrode 122*a*, at least one second electrode 124*a*, and a connecting layer 126*a*. The first electrode 122*a* and the second electrode 124*a* are separated from each other and connected to the connecting layer 126*a*. Moreover, the epitaxial structure E is disposed on the electrode connecting layer 120*a* and electrically connected with the electrode connecting layer 120*a*. The pads 170 are disposed on the lower surface 114 of the substrate 110*a* and connected to the conductive through vias 116*a*.

In addition, the light emitting devices 100 and 100*a* of this embodiment may further include an insulating layer 130. The insulating layer 130 is disposed on the electrode connecting layer 120*a* and insulates the first electrode 122*a* and the second electrode 124*a*. The connecting layer 126*a* of the electrode connecting layer 120*a* at least has a buffer region S. In addition, the buffer region S is located between the insulating layer 130, the connecting layer 126*a*, and the substrate 110*a*, and exposes the upper surface 112 of the substrate 110. The epitaxial structure E of this embodiment includes a first type semiconductor layer 140, a light emitting layer 150, and a second type semiconductor layer 160. The first type semiconductor layer 140 is disposed on the insulating layer 130. In addition, the first electrode 122*a* penetrates the insulating layer 130 to be electrically connected to the first type semiconductor layer 140. The light emitting layer 150 is disposed on the first type semiconductor layer 140. The second type semiconductor layer 160 is disposed on the light emitting layer 150. In addition, the second electrode 124*a* penetrates the insulating layer 130, the first type semiconductor layer 140, and the light emitting layer 150 to be electrically connected with the second type semiconductor layer 160. Here, a thickness of the epitaxial structure E is in a range from 3 micrometers to 15 micrometers, for example, and preferably in a range from 4 micrometers to 8 micrometers.

As shown in FIGS. 1A and 1C, an edge 181 of the sheet-shaped wavelength converting layers 180 and 180*a* is aligned to an edge 111 of the substrate 110*a*, and the sheet-shaped wavelength converting layers 180*a* and 180*b* are disposed at the outermost side. Thus, the sheet-shaped wavelength converting layers 180 and 180*a* that are slim and have a high hardness may be manufactured by using a packaging gel having the wavelength converting substance with a high concentration. The hardness of the sheet-shaped wavelength converting layers 180 and 180*a* are in a range of Shore D 30 to Shore D 90 when measured with the Shore Durometer. In this way, the devices become lighter and slimmer, and the light emitting devices 100 and 100*a* are protected. Here, the first wavelength converting unit layers 182 and 182*a*, the second wavelength converting unit layers 186 and 186*a*, and the substrate 110*a* are planar structures extending horizontally. Thus, compared with the conventional light emitting chip, which is packaged by using a packaging gel and formed as a light emitting device packaged with a curved-shaped package gel, the light emitting devices 100 and 100*a* have a thinner thickness and a smaller size. Moreover, the substrate 110*a* of this embodiment may have a preferable heat dissipating effect. The substrate 110*a* is a substrate having a thermal conductivity coefficient greater than 10 W/m-K, and the substrate 110*a* may also be an insulating substrate having a resistivity greater than $10^{10}$ Ω·m. Here, the substrate 110*a* is a ceramic substrate or a sapphire substrate, for example. Preferably, the substrate 110*a* is a ceramic substrate having heat dissipating and insulating effects. A thickness of the substrate 110*a* is in a range from 100 micrometers to 700 micrometers, for example, and preferably in a range from 100 micrometers to 300 micrometers. As shown in FIGS. 1A and 1C, the conductive through vias 116*a* of this embodiment are formed by filling a conductive material into through holes of the substrate 110*a*, and as material of the conductive material is a metallic material such as copper, gold, etc., for example. Two ends of the conductive through vias 116*a* of the substrate 110*a* are respectively electrically connected to the electrode connecting layer 120*a* and the pads 170. In addition, a cross-section profile of the conductive via 116*a* may have different shapes according to different manufacturing processes. For example, if a mechanical drilling process is adopted, the cross-sectional profile of the conductive via may be in a rectangular shape (not shown). If a laser drilling process is adopted, the cross-sectional profile of the conductive via 116*a* may be in a shape of trapezoid, as shown in FIGS. 1A and 1C. Also, if the laser drilling process is adopted, an ablating direction of laser may influence the cross-sectional profile of the conductive via. For example, if the laser is irradiated from the upper surface 112 of the substrate 110*a*, the cross-sectional profile of the conductive via is in a shape of a reversed trapezoid where the upper part is wider and the lower part is narrower (not shown). If the laser is irradiated from the lower surface 114 of the substrate 110*a*, the cross-sectional profile of the conductive via 116*a* is in a shape of a normal trapezoid where the upper part is narrower and the lower part is wider, as shown in FIGS. 1A and 1C. The cross-sectional profiles of the conductive via all fall within the scope claimed in the invention, and are not limited to the cross-sectional profile of the conductive via 116*a* shown in this embodiment.

Moreover, the first electrode 122*a* of the electrode connecting layer 120*a* in this embodiment is a P-type electrode, for example, and the second electrode 124*a* is an N-type electrode, for example. However, the invention is not limited thereto. Here, a material of the first electrode 122*a* and the second electrode 124*a* may be selected from chromium, platinum, gold, an alloy of the aforesaid materials, and a combination of the aforesaid materials. Moreover, the connecting layer 126*a* is disposed between the substrate 110*a* and the first electrode 122*a* and between the substrate 110*a* and the second electrode 124*a*. A material of the connecting layer 126*a* may be selected from titanium, gold, indium, tin, chromium, platinum, an alloy of the aforesaid materials, and a combination of the aforesaid materials. It should be noted that the first electrode 122*a*, the second electrode 124*a*, and the connecting layer 126*a* may be formed of the same or different materials, and may be formed integrally or separately. The invention does not intend to impose limitations in these regards. As shown in FIGS. 1A and 1C, an orthogonal projection area of a part of the connecting layer 126*a* connected to the second electrode 124*a* on the substrate 110*a* is greater than an orthogonal projection area of a part of the connecting layer 126*a* connected to the first electrode 122*a* on the substrate 110*a*. In other words, the area of the part of the connecting layer 126*a* connected to the second electrode 124*a* in this embodiment is greater than the area of the part of the connecting layer 126*a* connected to the first electrode 122*a*. In particular, the first electrode 122*a* and the second electrode 124*a* are located at the same side. Namely, the first electrode 122*a* and the second electrode 124*a* are located on a side of the first type semiconductor layer 140.

In this embodiment, the electrode connecting layer 120*a* may have the buffer region S, and the buffer region S is located between the connecting layer 126*a*, the substrate 110*a*, and the insulating layer 130. Here, the buffer region S is substantially a gap. During the manufacturing process of the light emitting devices 100 and 100*a*, the buffer region S may serve as a buffer for materials with different thermal expansion coefficients and thereby reduces an effect of thermal stress in operations under various temperatures. In this way, a structural reliability of the light emitting devices 100 and 100a of this embodiment is enhanced. It should be noted that an orthogonal projection area of the buffer region S and the connecting layer 126a on the substrate 110a is equal to an area of the upper surface 112 of the substrate 110a.

Besides, in the epitaxial structure E of this embodiment, the first type semiconductor layer 140 is a P-type semiconductor layer, for example, and the second type semiconductor layer 160 is an N-type semiconductor layer, for example. However, the invention is not limited thereto. An edge of the epitaxial structure E may be smaller than or equal to the edge 111 of the substrate 110a. Preferably, an orthogonal projection area of the epitaxial layer E on the substrate 110a is in a range from 0.8 times to 1 time of the area of the upper surface 112 of the substrate 110a. Besides, since the pads 170 of this embodiment are located on the lower surface 114 of the substrate 110a, the light emitting devices 100 and 100a may be electrically connected to an external circuit (not shown) through the pads 170, and may rapidly transmit heat generated by the light emitting devices 100 and 100a outside through the pads 170. It should also be noted that, as shown in FIGS. 1A and 1C, an edge 121 of the electrode connecting layer 120a of this embodiment may be aligned with the edge 111 of the substrate 110a, and an edge of the pads 170 may be aligned with the edge 111 of the substrate 110a. In other words, the edges of the electrode connecting layer 120a, the substrate 110a, and the pads 170 are located on the same side surface. Thus, the light emitting devices 100 and 100a of this embodiment have a shorter overall width, and thus have a smaller volume.

Moreover, to increase an overall light emitting efficiency of the light emitting devices 100 and 100a, diffusive or reflective particles may be added in the sheet-shaped wavelength converting layers 180 and 180a, so as to scatter and reflect the light. Such configuration still falls within the scope claimed by the invention. Moreover, since the sheet-shaped wavelength converting layers 180 and 180a of this embodiment are implemented as a planar structure, a light emitting angle of the light emitting devices 100 and 100a in general is smaller than 140 degrees, for example, and consequently has a preferable collimating property, thereby offering more flexibility for the application of the subsequent optical design.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2:
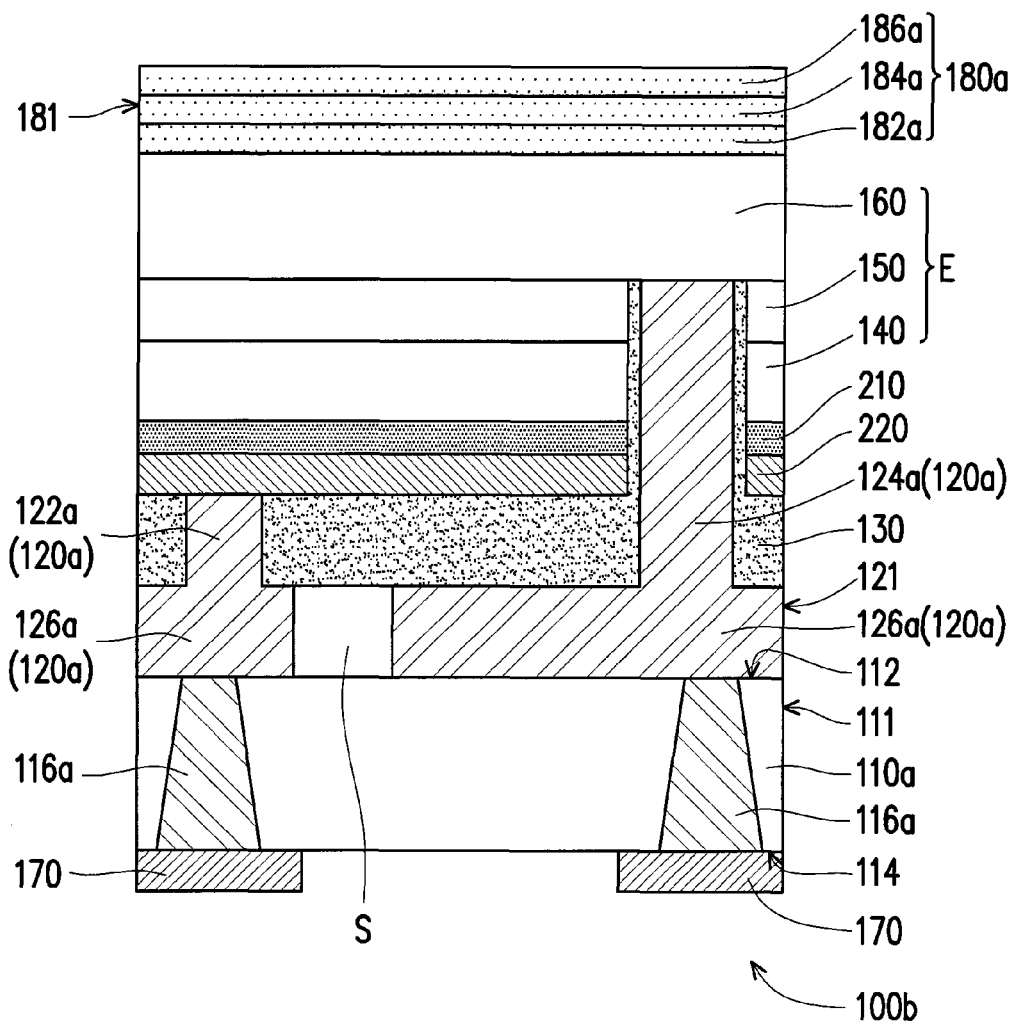
FIG. 2 is a cross-sectional schematic view illustrating a light emitting device according to another embodiment of the invention.

FIG. 2 is a cross-sectional schematic view illustrating a light emitting device according to another embodiment of the invention. Referring to FIGS. 2 and 1C together, a light emitting device 100b of this embodiment is similar to the light emitting device 100a of FIG. 1C, except that the light emitting device 100b of this embodiment further includes an ohmic contact layer 210 disposed between the first type semiconductor layer 140 and the insulating layer 130. Moreover, the light emitting device 100b may further include a reflecting layer 220 disposed between the ohmic contact layer 210 and the insulating layer 130. Here, by disposing the ohmic contact layer 210, an electrical contact between the first type semiconductor layer 140 and the reflective layer 220 may be facilitated. A material of the ohmic contact layer 210 is nickel or nickel oxide, for example. A material of the reflecting layer 220 is silver, for example, capable of reflecting light emitted from the light emitting layer 150 to facilitate the light emitting efficiency. It should be noted in particular that the ohmic contact layer 210 may be formed in a cross-sectional pattern implemented as a non-periodic island-like pattern (not shown). Namely, there are gaps between the first type semiconductor layer 140, the first electrode 122a, and the reflecting layer 220, so as to facilitate an electrical connection and bonding between the ohmic contact layer 210 and the first type semiconductor layer 140 and among the ohmic contact layer 210 and the first electrode 122a and the reflecting layer 220. Besides, a thickness of the ohmic contact layer 210 and a thickness of the reflecting layer 220 of this embodiment are in a range from 1000 Angstroms to 7000 Angstroms, for example, and preferably in a range from 1000 Angstroms to 3500 Angstroms.

Figure 3:
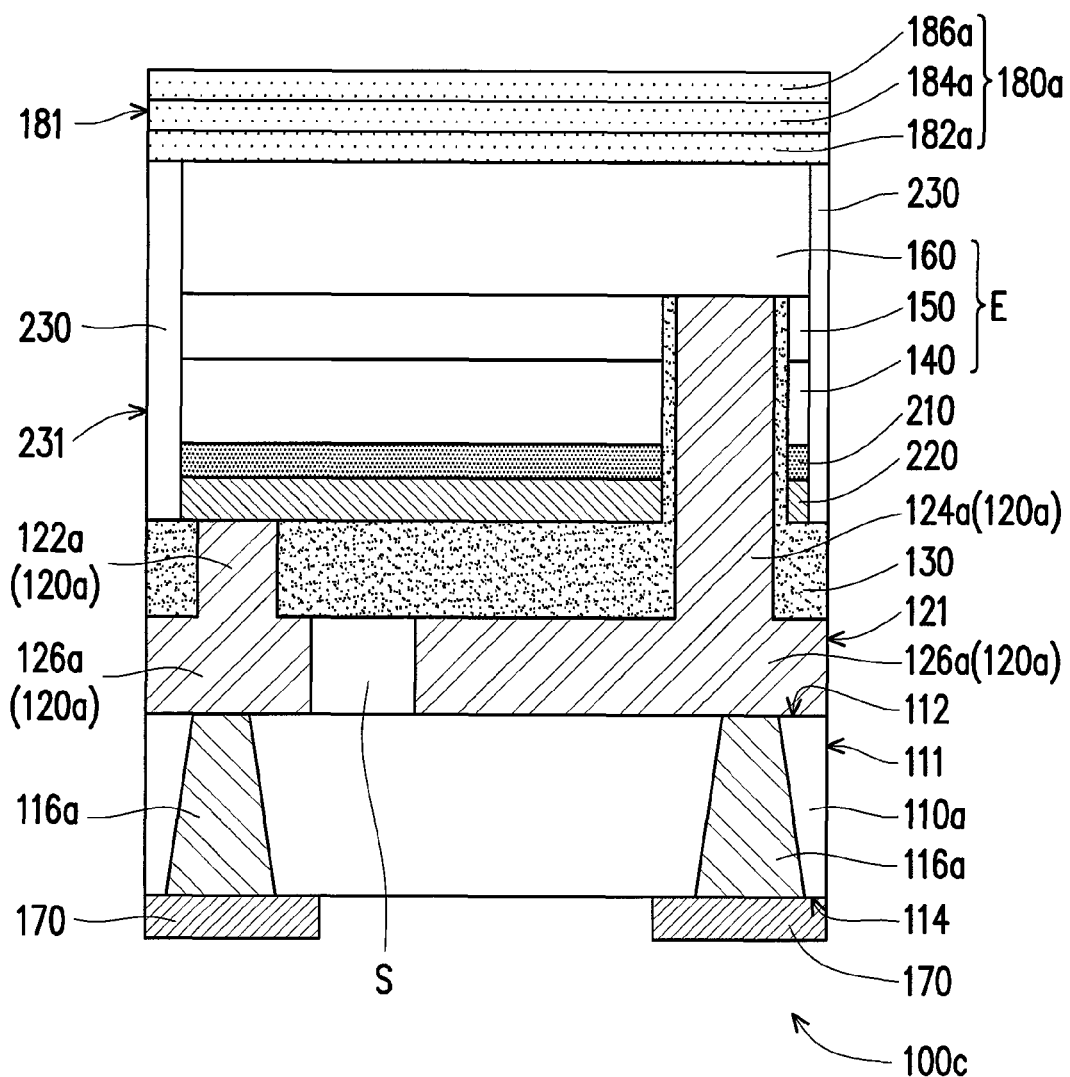
FIG. 3 is a cross-sectional schematic view illustrating a light emitting device according to another embodiment of the invention.

FIG. 3 is a cross-sectional schematic view illustrating a light emitting device according to another embodiment of the invention. Referring to FIGS. 3 and 2 together, a light emitting device 100c of this embodiment is similar to the light emitting device 100b in FIG. 2, except that the light emitting device 100c of this embodiment further includes an insulating protection layer 230 covering edges of the first type semiconductor layer 140, the light emitting layer 150, and the second type semiconductor layer 160. In addition, an edge 231 of the insulating protection layer 230 is substantially aligned to an edge of insulating layer 130. Here, a material of the insulating protection layer 230 may be silicon dioxide, silicon nitride, or a combination of the aforesaid materials. The insulating protection layer 230 is disposed to effectively protect the edge of the epitaxial structure E, so as to prevent moisture and oxygen, thereby effectively increasing a product reliability of the light emitting device 100c. It should be noted that, in this embodiment, the insulating protection layer 230 further covers edges of the ohmic contact layer 210 and the reflecting layer 220, such that the light emitting device 100c has a preferable reliability.

Figure 4:
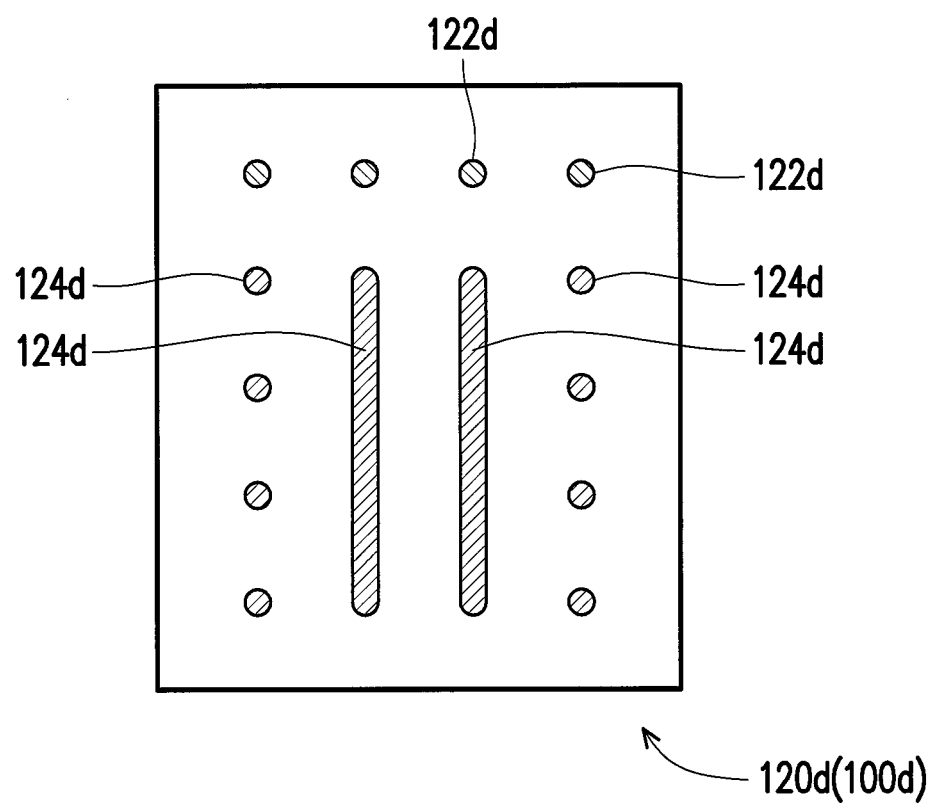
FIG. 4 is a top schematic view illustrating an electrode of a light emitting device according to another embodiment of the invention.

FIG. 4 is a top schematic view illustrating an electrode of a light emitting device according to another embodiment of the invention. Referring to FIGS. 4 and 1C together, a light emitting device 100d of this embodiment is similar to the light emitting device 100a of FIG. 1C, except that an electrode connecting layer 120d of this embodiment has a plurality of first electrodes 122d and a plurality of second electrodes 124d. In a top view, a profile of each of the first electrodes 122d is dot-like profile, such as a round spot, and a profile of each of the second electrodes 124d is a combination of a linear profile and a dot-like profile, such as a combination of a straight line and a round spot. Here, the second electrodes 124d of this embodiment include electrodes with a round profile from the top view and electrodes with a linear profile from the top view at the same time. In addition, as shown in FIG. 4, the electrode patterns are separated from each other. Since the second electrodes 124d in the light emitting device 100d of this embodiment have the electrode patterns with dot-like and linear profiles from the top view, a current distribution may be more even and a forward voltage may be effectively lowered.

Figure 5:
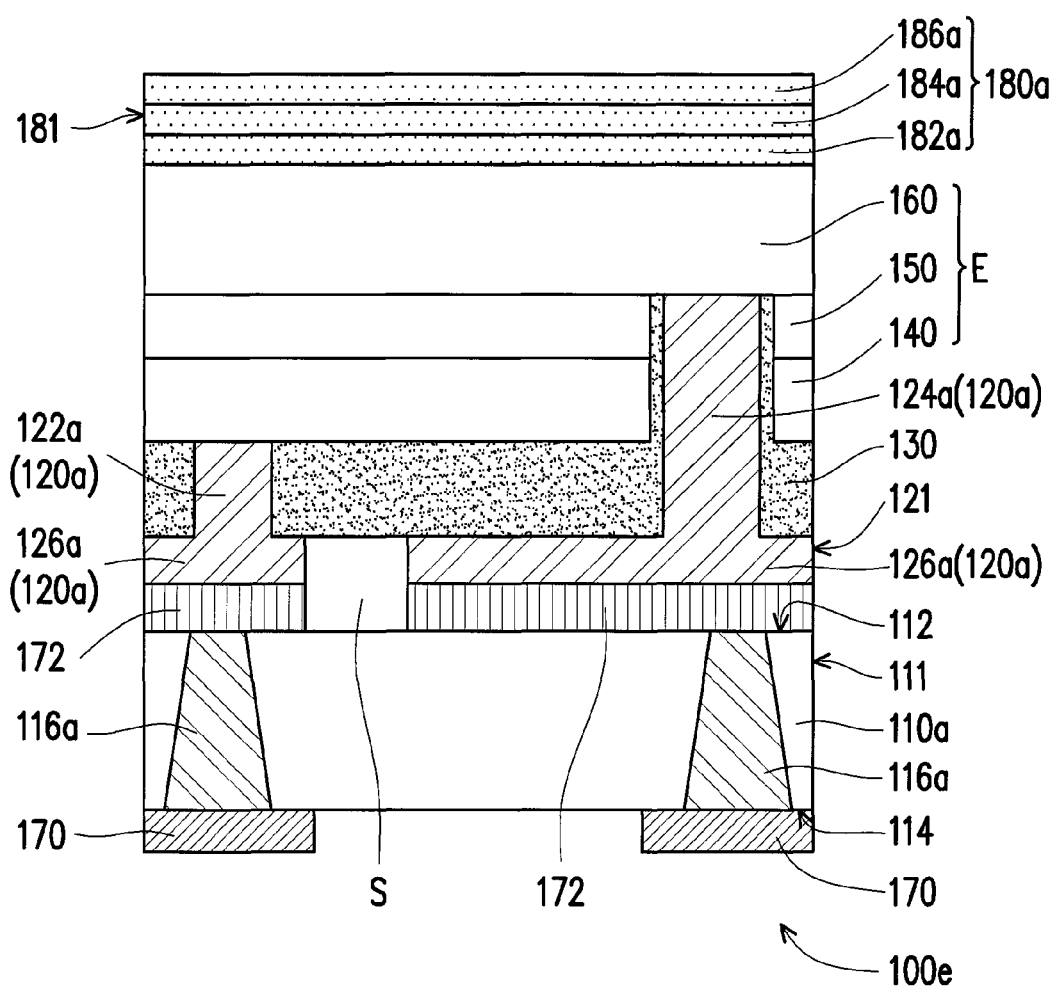
FIG. 5 is a cross-sectional schematic view illustrating a light emitting device according to another embodiment of the invention.

FIG. 5 is a cross-sectional schematic view illustrating a light emitting device according to another embodiment of the invention. Referring to FIGS. 5 and 1C together, a light emitting device 100e of this embodiment is similar to the light emitting device 100a of FIG. 1C, except that the light emitting device 100e further includes a plurality of electrode pads 172 disposed on the upper surface 112 of the substrate 110a and connected to the conductive through vias 116a and the electrode connecting layer 120a. In addition, the orthogonal projection of the buffer region S on the substrate 110a is not overlapped with an orthogonal projection of the electrode pads 172 on the substrate 110a. The pads 170 are disposed on the lower surface 114 of the substrate 110a and connected to the conductive through vias 116a. A distance between the pads 170 is greater than a distance between the electrode pads 172. Since a width of the electrode pad 172 is smaller than the distance between the pads 170, an area of the electrode pad 172 connected to the connecting layer 126a is greater, a connection between the connecting layer 126a and the substrate 110a is more preferable, and the heat generated by the epitaxial structure E may be transmitted to the substrate 110a more rapidly, so as to prevent the light emitting efficiency of the epitaxial structure E from being reduced due to high temperature. More specifically, the electrode pads 172 are disposed in correspondence with the connecting layer 126a of the electrode connecting layer 120a. An orthogonal projection area of the electrode pad 172 on the substrate 110a completely overlaps the orthogonal projection of the connecting layer 126a on the substrate 110a, and the projection areas thereof are the same. In addition, the buffer region S is located between the electrode pads 172, the substrate 110a, and the connecting layer 126a. Thus, during a manufacturing process of the light emitting device 100e, the buffer region S may serve as a buffer for bonding of the electrode connecting layer 120a and the electrode pads 172 in operations under different temperatures. In this way, a reliability of the light emitting device 100e may be improved. In addition, a material of the electrode pad 172 may be selected from copper, chromium, platinum, gold, an alloy of the aforesaid materials, and a combination of the aforesaid materials.

Figure 6:
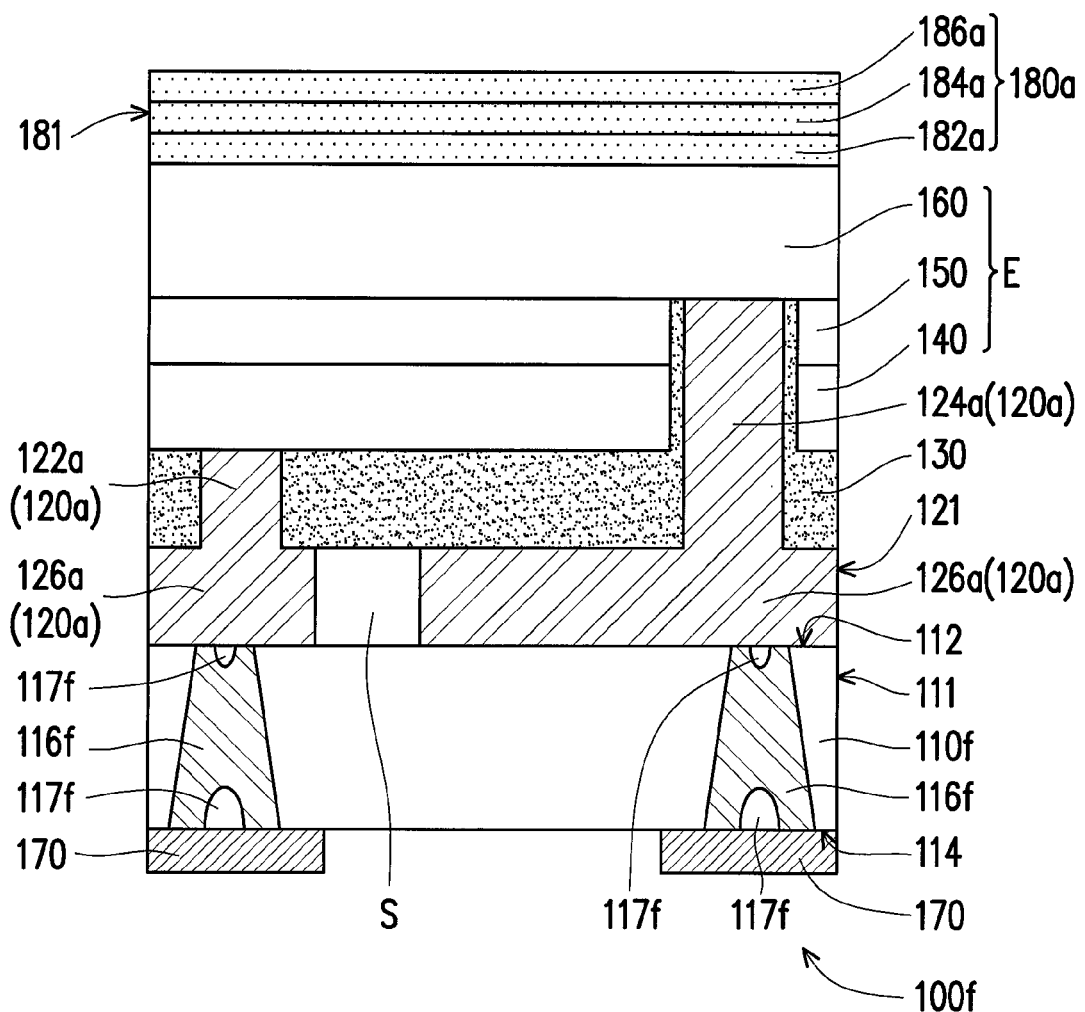
FIG. 6 is a cross-sectional schematic view illustrating a light emitting device according to another embodiment of the invention.

FIG. 6 is a cross-sectional schematic view illustrating a light emitting device according to another embodiment of the invention. Referring to FIGS. 6 and 1C together, a light emitting device 100f of this embodiment is similar to the light emitting device 100a of FIG. 1C, except that each conductive via 116f of a substrate 110f in this embodiment at least has a space 117f (two spaces are shown in FIG. 6 for an illustrative purpose). The space 117f may serve as a buffer between the conductive via 116f and the electrode connecting layer 120a and between the conductive via 116f and the pad 170. Here, the space 117f in FIG. 6 may be close or connected to the upper surface 112 or the lower surface 114 of the substrate 110f. However, the invention is not limited thereto. The space 117f is located in the conductive via 116f.

Figure 7:
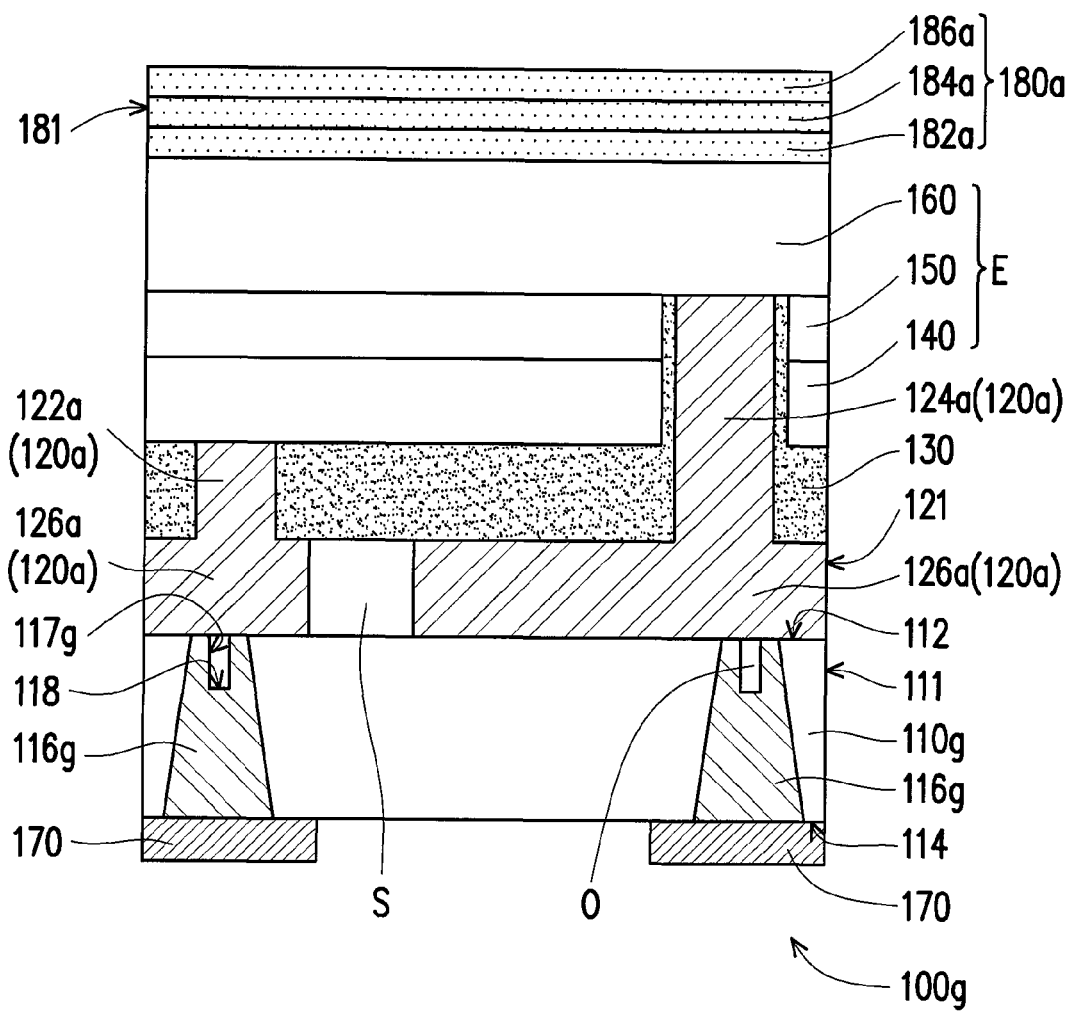
FIG. 7 is a cross-sectional schematic view illustrating a light emitting device according to another embodiment of the invention.

FIG. 7 is a cross-sectional schematic view illustrating a light emitting device according to another embodiment of the invention. Referring to FIGS. 7 and 6 together, a light emitting device 100g of this embodiment is similar to the light emitting device 100f of FIG. 6, except that a space 117g in each conductive via 116g of this embodiment extends in a direction from the upper surface 112 to the lower surface 114 of the substrate 110g and has a bottom surface 118. In other words, the space 117g of each conductive via 116g has an opening O facing the upper surface 112. Here, the opening O is connected to the conductive via 116g and the electrode connecting layer 120a, and may serve as a buffer of materials with different thermal expansion coefficients during a manufacturing process under different temperatures.

Figure 8:
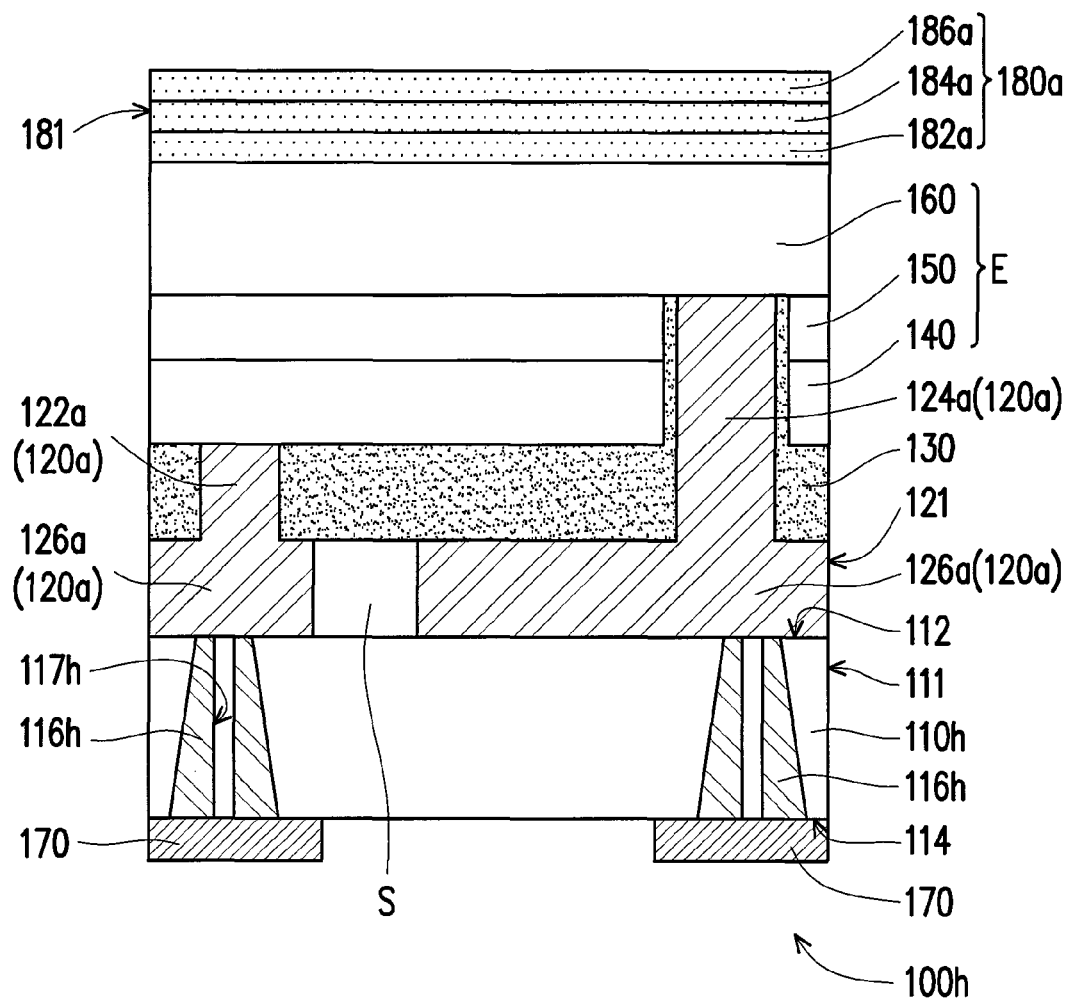
FIG. 8 is a cross-sectional schematic view illustrating a light emitting device according to another embodiment of the invention.

FIG. 8 is a cross-sectional schematic view illustrating a light emitting device according to another embodiment of the invention. Referring to FIGS. 8 and 6 together, a light emitting device 100h of this embodiment is similar to the light emitting device 100f of FIG. 6, except that a space 117h of each conductive via 116h is a through hole penetrating a substrate 110h and connecting the upper surface 112 and the lower surface 114. In other embodiments not shown herein, a space may also be present in the conductive via 116h without contacting the electrode connecting layer 120a or the pad 170, as long as the space is present as buffer between the conductive via 116h and the electrode connecting layer 120a or the pad 170. These embodiments also fall within the scope claimed by the invention.

Figure 9:
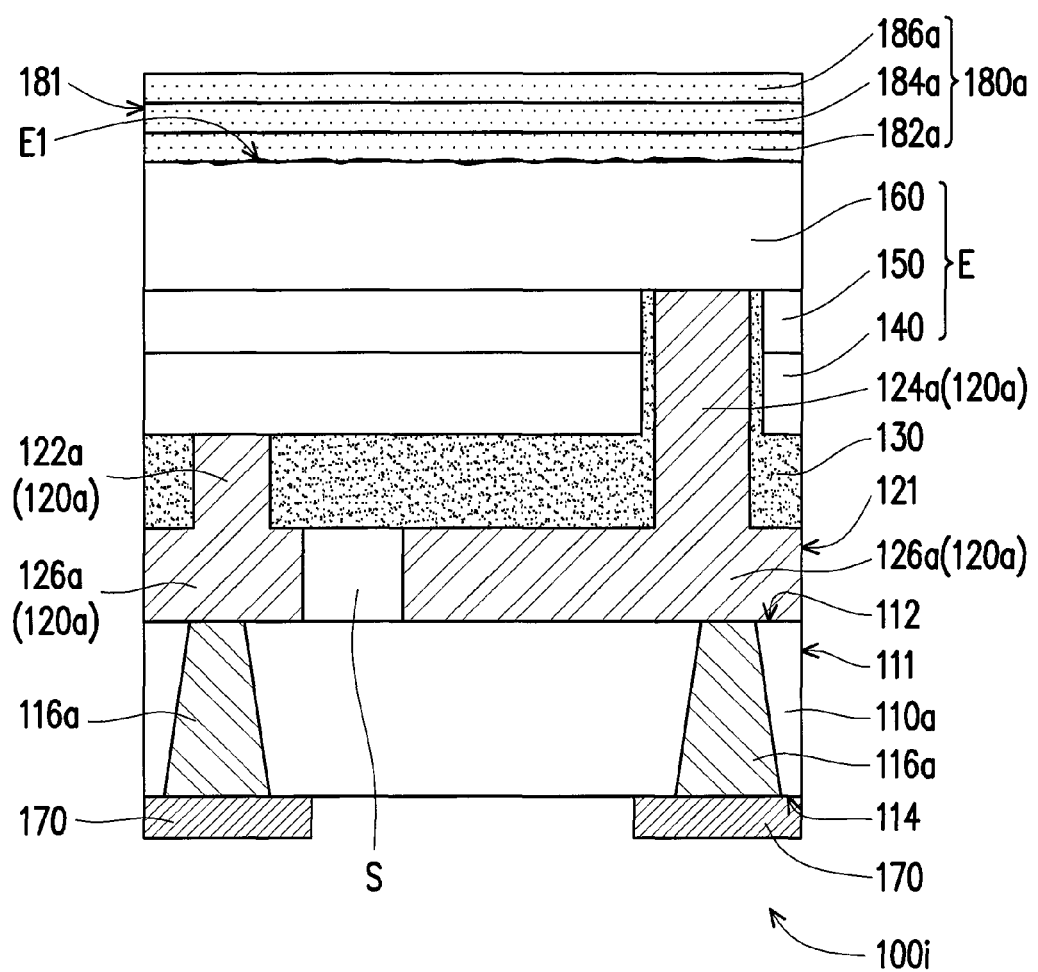
FIG. 9 is a cross-sectional schematic view illustrating a light emitting device according to another embodiment of the invention.

FIG. 9 is a cross-sectional schematic view illustrating a light emitting device according to another embodiment of the invention. Referring to FIGS. 9 and 1C together, a light emitting device 100i of this embodiment is similar to the light emitting device 100a of FIG. 1C, except that the epitaxial structure E of the light emitting device 100i in this embodiment has a rough surface E1, and the rough surface E1 directly contacts the sheet-shaped wavelength converting layer 180a. In other words, a surface where the epitaxial structure E and the sheet-shaped wavelength converting layer 180a contact is not a smooth surface. There may be micrometer-level voids between the rough surface E1 and the sheet-shaped wavelength converting layer 180a. With such structural design, light generated by the epitaxial structure E may be scattered, making the light enter the sheet-shaped wavelength converting layer 180a more evenly. In this way, an overall light emitting efficiency of the light emitting device 100i may be effectively increased. In addition, voids between the epitaxial structure E and the sheet-shaped wavelength converting layer 180a may serve as a buffer between the epitaxial structure E and the sheet-shaped wavelength converting layer 180a and facilitate a bonding effect between the epitaxial structure E and the sheet-shaped wavelength converting layer 180a, thereby increasing a reliability of the light emitting device 100i. Here, if a size of the void is smaller than the micrometer-level, such as smaller than 0.1 micrometers, the effect of scattering may not be preferable, while if the size of the void is greater than the micrometer-level, such as greater than 10 micrometers, the void becomes too big, and a bonding area between the epitaxial structure E and the sheet-shaped wavelength converting layer 180a is too small, making the bonding effect not preferable.

Figure 10:
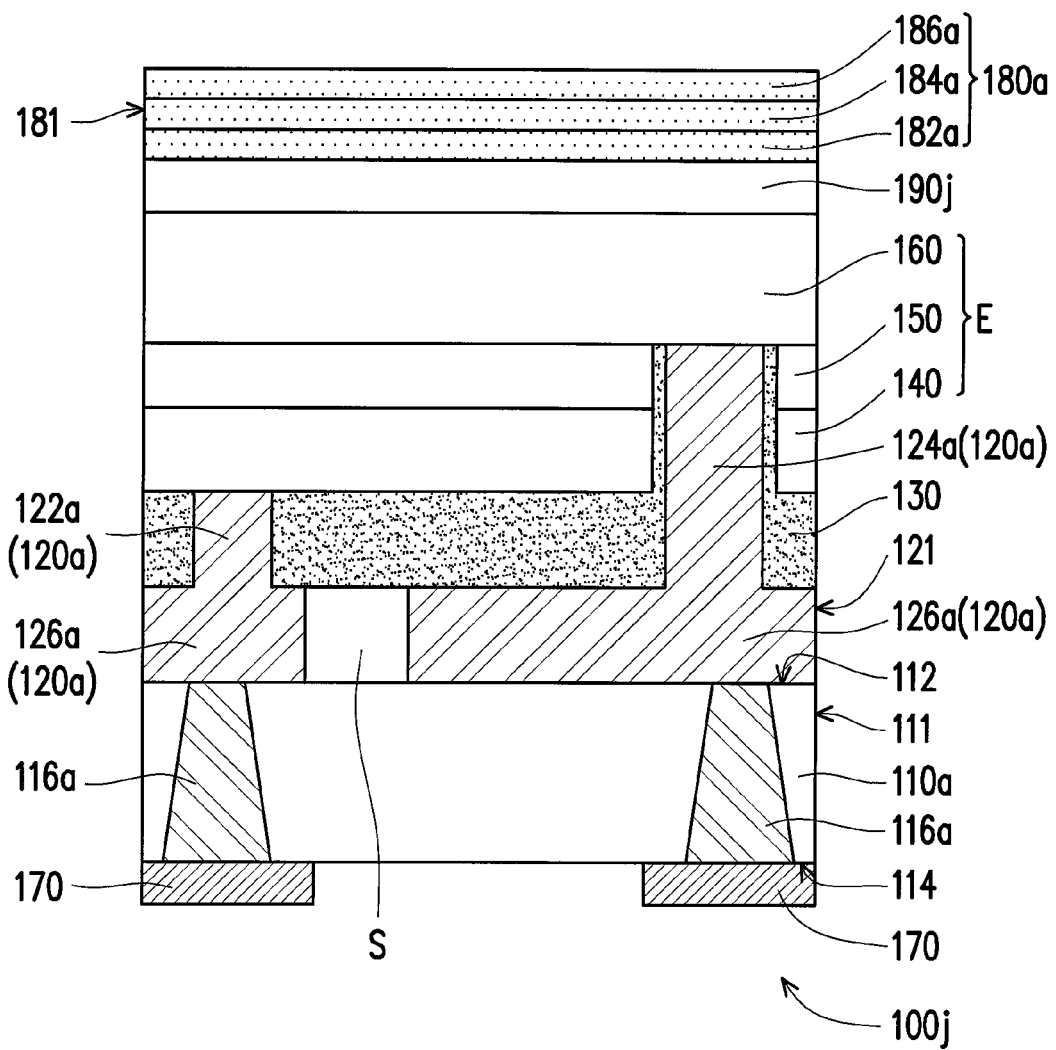
FIG. 10 is a cross-sectional schematic view illustrating a light emitting device according to another embodiment of the invention.

FIG. 10 is a cross-sectional schematic view illustrating a light emitting device according to another embodiment of the invention. Referring to FIGS. 10 and 1C, a light emitting device 100j of this embodiment is similar to the light emitting device 100a of FIG. 1C, except that the light emitting device 100j of this embodiment further includes an optical coupling layer 190j, and the optical coupling layer 190j is disposed between the sheet-shaped wavelength converting layer 180a and the second type semiconductor layer 160 of the epitaxial structure E, so as to facilitate a light emitting efficiency of the light emitting device 100j. Here, a thickness of the optical coupling layer 190j is smaller than 10 micrometers, and may serve as a buffer between the epitaxial structure E and the sheet-shaped wavelength converting layer 180a, and may render a preferable bonding effect between the epitaxial structure E and the sheet-shaped wavelength converting layer 180a. Here, an edge of the optical coupling layer 190j is aligned with the edge of the second type semiconductor layer 160 of the epitaxial structure E.

More specifically, a material of the optical coupling layer 190j of this embodiment is a nitride material, such as gallium nitride. Alternatively, a material of the optical coupling layer 190*j* is substantially the same as a material of the second type semiconductor layer 160, thereby rendering a preferable bonding effect. However, the invention is not limited thereto. Besides, to facilitate an overall light emitting efficiency of the light emitting device 100*j*, diffusive particles, reflective particles, scattering particles, or at least two kinds of the aforesaid particles may be added to the optical coupling layer 190*j*, such that the light generated by the epitaxial structure E may be scattered, reflected, and diffused. Also, a refractive index between the optical coupling layer 190*j*, the sheet-shaped wavelength converting layer 180*a*, and the epitaxial structure E may be changed, such that a refractive index of the optical coupling layer 190*j* is smaller than a refractive index of the second type semiconductor layer 160 and greater than a refractive index of the sheet-shaped wavelength converting layer 180*a*, so as to facilitate a light emitting efficiency. Such configuration also falls within the scope claimed by the invention.

Figure 11:
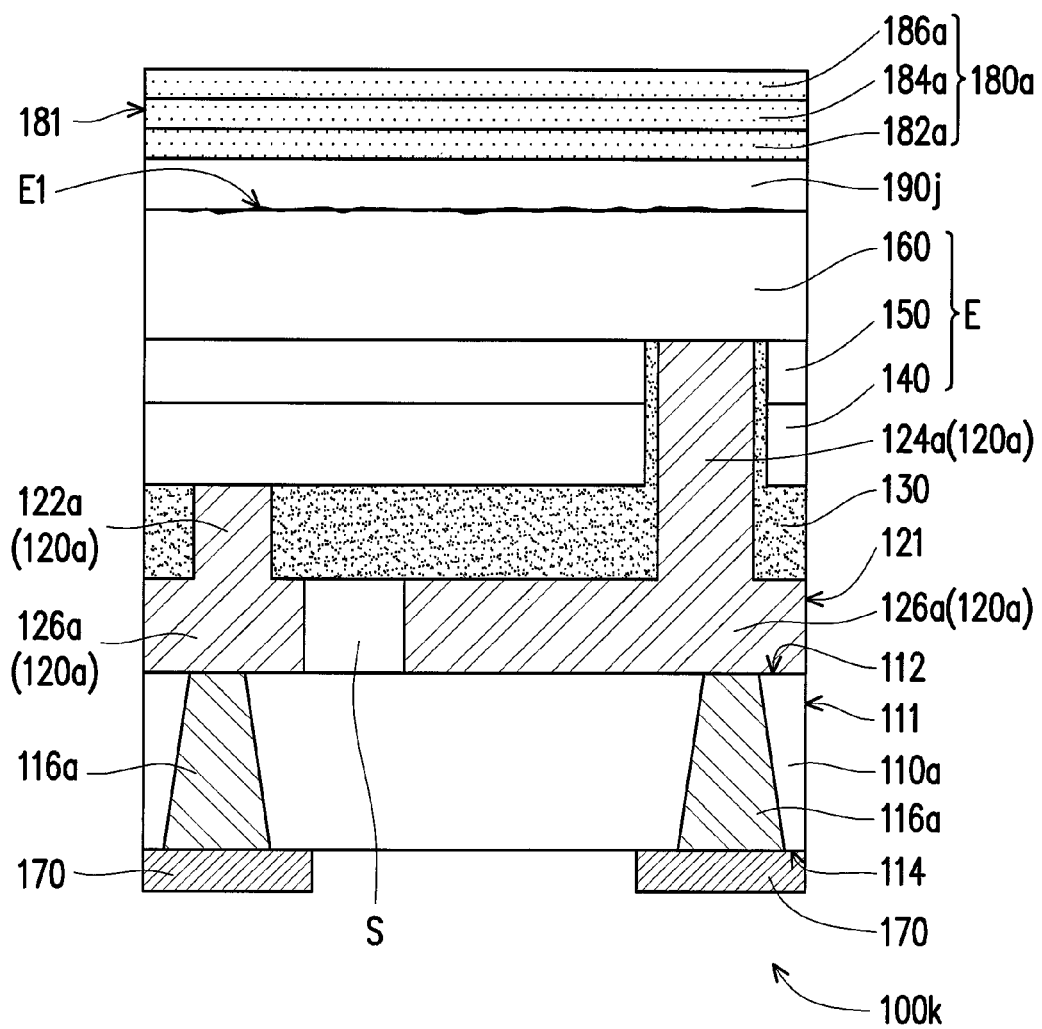
FIG. 11 is a cross-sectional schematic view illustrating a light emitting device according to another embodiment of the invention.

FIG. 11 is a cross-sectional schematic view illustrating a light emitting device according to another embodiment of the invention. Referring to FIGS. 11 and 10 together, a light emitting device 100*k* of this embodiment is similar to the light emitting device 100*j* of FIG. 10, except that the epitaxial structure E of the light emitting device 100*k* in this embodiment has the rough surface E1, and the rough surface directly contacts the optical coupling layer 190*j*. Namely, a surface where the epitaxial structure E and the optical coupling layer 190*j* contact is not a smooth surface. There may be micrometer-level voids between the rough surface E1 and the optical coupling layer 190*j*. With such structural design, the light generated by the epitaxial structure E may be scattered. In this way, an overall light emitting efficiency of the light emitting device 100*k* may be effectively increased. In addition, voids between the epitaxial structure E and the optical coupling layer 190*j* may also serve as a buffer region between two layers. Here, if a size of the void is smaller than the micrometer-level, such as smaller than 0.1 micrometers, the effect of scattering may not be preferable, while if the size of the void is larger than the micrometer-level, such as greater than 10 micrometers, the void becomes too big, and a bonding area between the epitaxial structure E and the optical coupling layer 190*j* is too small, making the bonding effect not preferable.

Figure 12:
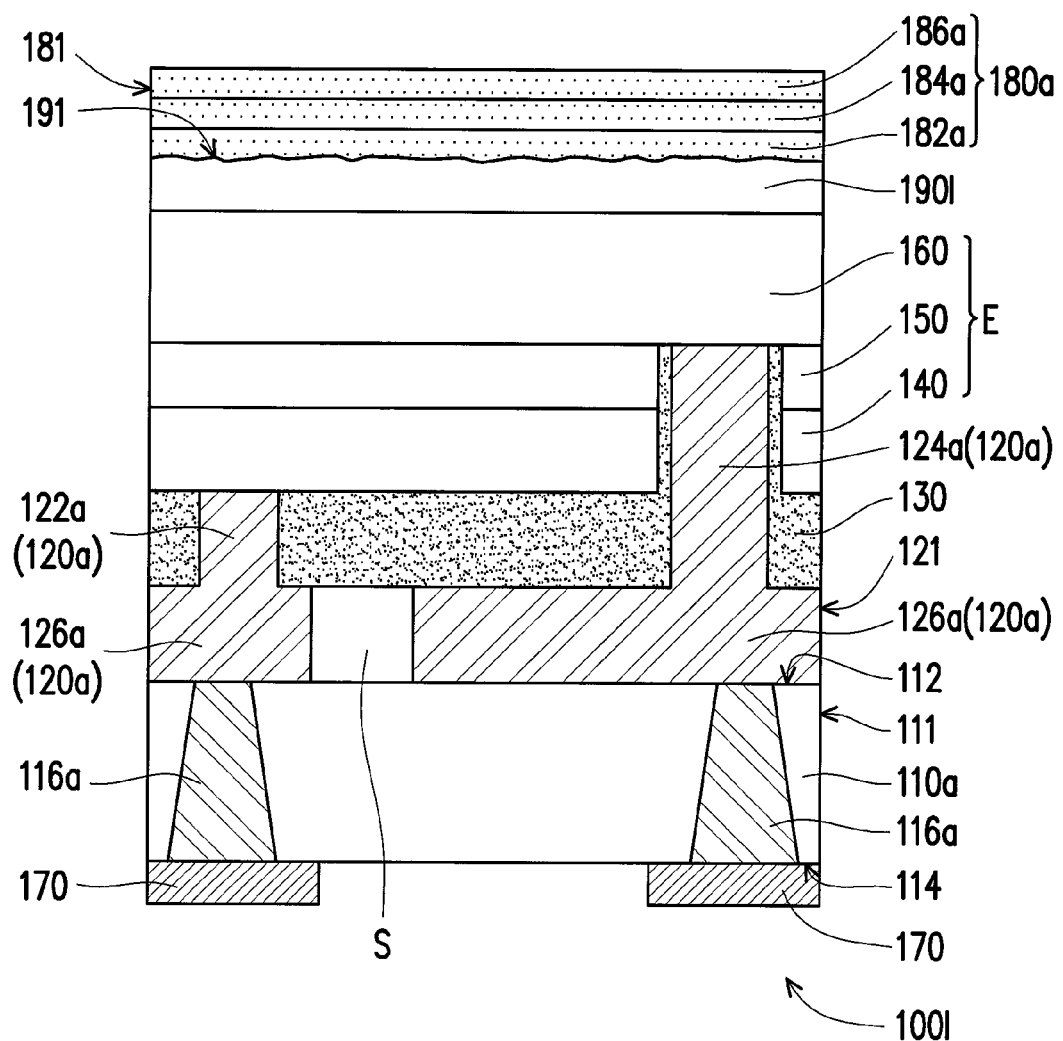
FIG. 12 is a cross-sectional schematic view illustrating a light emitting device according to another embodiment of the invention.

FIG. 12 is a cross-sectional schematic view illustrating a light emitting device according to another embodiment of the invention. Referring to FIGS. 12 and 10 together, a light emitting device 100*l* of this embodiment is similar to the light emitting device 100*j* of FIG. 10, except that an optical coupling layer 190*l* of the light emitting device 100*l* in this embodiment has a rough surface 191, and the rough surface 191 directly contacts the sheet-shaped wavelength converting layer 180*a*. Namely, a surface where the optical coupling layer 190*l* and the sheet-shaped wavelength converting layer 180*a* contact is not a smooth surface (i.e., having gaps). With such structural design, the light generated by the epitaxial structure E may be scattered. In this way, an overall light emitting efficiency of the light emitting device 100*l* may be effectively increased. Besides, the gaps between the optical coupling layer 190*l* and the sheet-shaped wavelength converting layer 180*a* may serve as a buffer between two different layers, and may render a preferable bonding effect between the optical coupling layer 190*l* and the sheet-shaped wavelength converting layer 180*a*, thereby increasing a reliability of the light emitting device 100*l*. It should be noted in particular that the optical coupling layer 190*l* may also keep gaps between the sheet-shaped wavelength converting layer 180*a* and between the epitaxial structure E at the same time, and the invention is not limited thereto.

Figure 13:
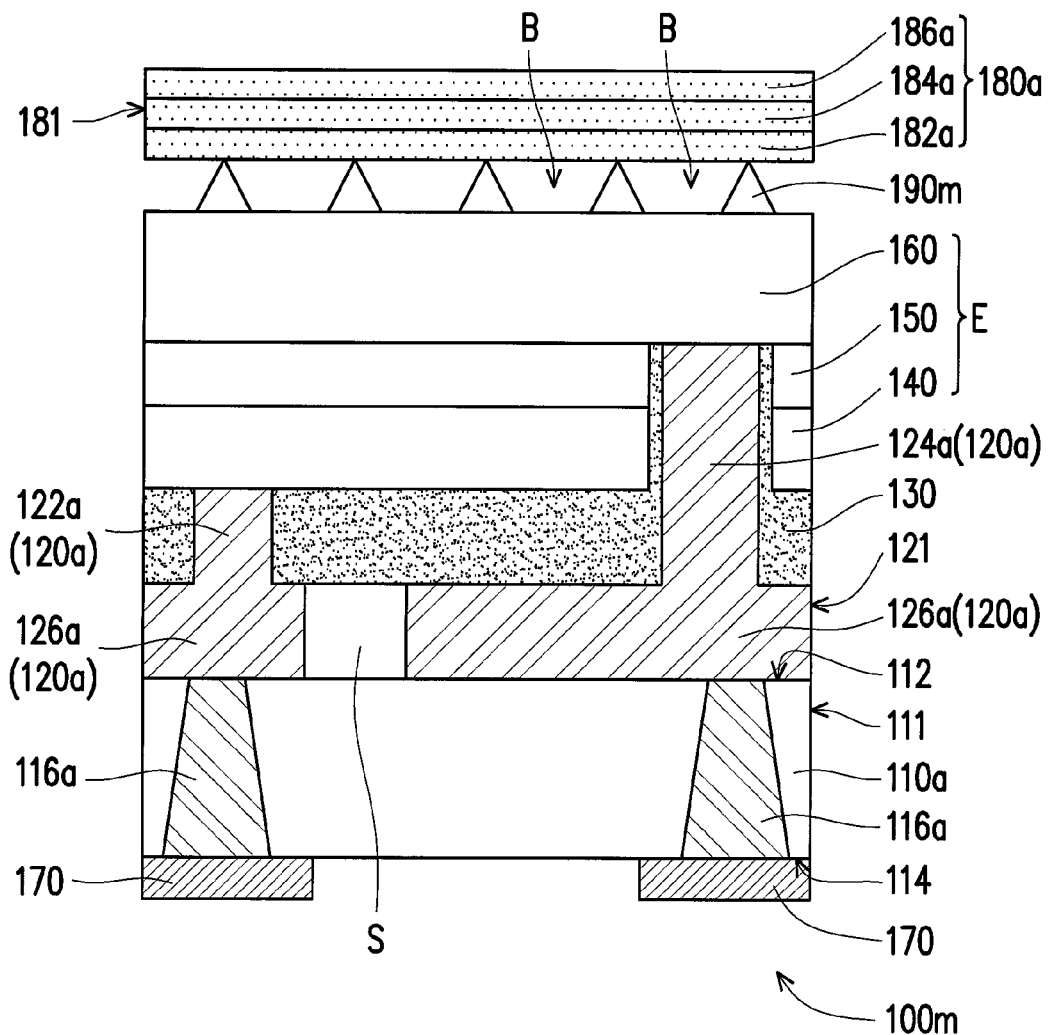
FIG. 13 is a cross-sectional schematic view illustrating a light emitting device according to another embodiment of the invention.

FIG. 13 is a cross-sectional schematic view illustrating a light emitting device according to another embodiment of the invention. Referring to FIGS. 13 and 1C together, a light emitting device 100*m* of this embodiment is similar to the light emitting device 100*a* of FIG. 1C, except that the light emitting device 100*m* of this embodiment further includes an optical coupling layer 190*m*, and the optical coupling layer 190*m* is disposed between the sheet-shaped wavelength converting layer 180*a* and the second type semiconductor layer 160 of the epitaxial structure E. In addition, at least a gap B is kept between the optical coupling layer 190*m* and the sheet-shaped wavelength converting layer 180*a*. As shown in FIG. 13, the optical coupling layer 190*m* is a structure formed with a cross-sectional pattern as a periodic triangular patterns, and the gap B is present between two adjacent triangular patterns. Of course, in other embodiments not shown herein, the cross-sectional pattern of the optical coupling layer may also be other patterns and may be in a non-periodic arrangement. Such configuration still falls within the scope claimed by the invention. Since the optical coupling layer 190*m* of this embodiment and the sheet-shaped wavelength converting layer 180*a* do not contact in a smooth interface, such structural design allows the light generated by the epitaxial structure E to be scattered. In this way, an overall light emitting efficiency of the light emitting device 100*m* may be effectively increased. Besides, the gaps between the optical coupling layer 190*m* and the sheet-shaped wavelength converting layer 180*a* may serve as a buffer between two different layers, and may render a preferable bonding effect between the epitaxial structure E and the sheet-shaped wavelength converting layer 180*a*, thereby increasing a reliability of the light emitting device 100*m*.

Figure 14:
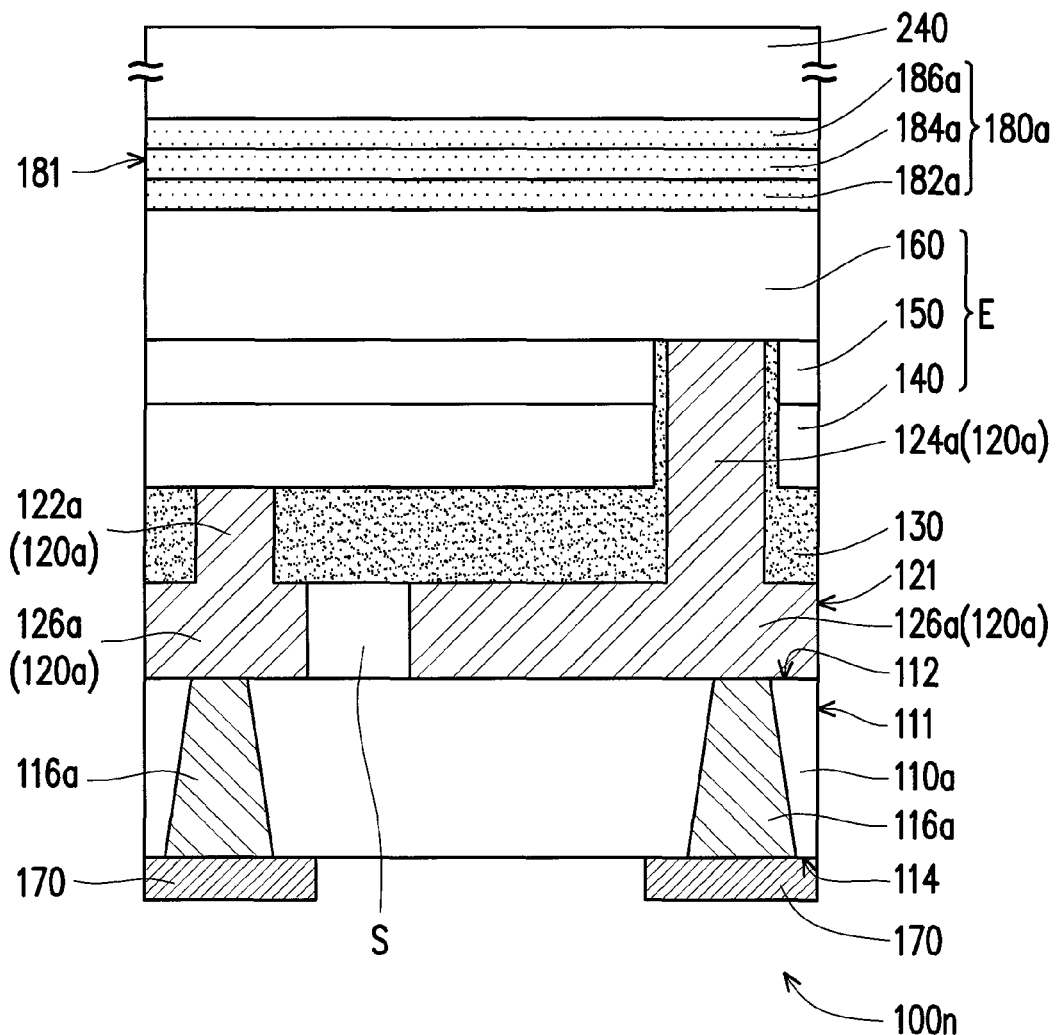
FIG. 14 is a cross-sectional schematic view illustrating a light emitting device according to another embodiment of the invention.

FIG. 14 is a cross-sectional schematic view illustrating a light emitting device according to another embodiment of the invention. Referring to FIGS. 14 and 1C at the same time, a light emitting device 100*n* of this embodiment is similar to the light emitting device 100*a* of FIG. 1C, except that the light emitting device 100*n* of this embodiment further includes a color mixing layer 240 disposed on the sheet-shaped wavelength converting layer 180*a*. An edge of the color mixing layer 240 is aligned to the sheet-shaped wavelength converting layer 180*a*, and a thickness of the color mixing layer 240 is three times to six times of the thickness of the first wavelength converting unit layer 182*a*. In this embodiment, the color mixing layer 240 is formed of a transparent material, such as glass, sapphire, or epoxy resin, for example, and the thickness of the color mixing layer 240 is greater than 100 micrometers. In other words, the thickness of the color mixing layer 240 is greater than a combination of the thickness of the epitaxial structure E and the thickness of the sheet-shaped wavelength converting layer 180*a*. Here, the color mixing layer 240 having a greater thickness may be considered as a light guide layer that evenly mixes the light emitted from the epitaxial structure E and light converted by the sheet-shaped wavelength converting layer 180*a*. In this way, an overall light emitting uniformity of the light emitting element 100*n* may be effectively increased.

Figure 15:
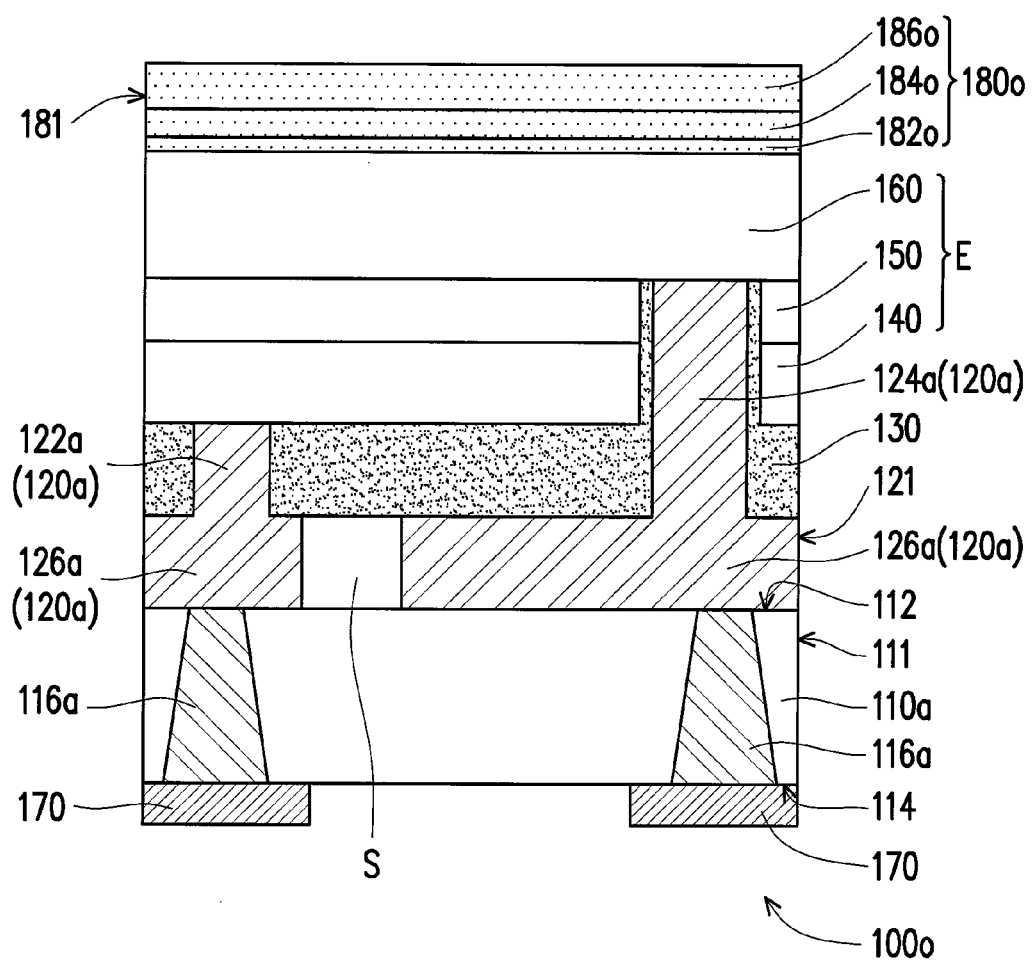
FIG. 15 is a cross-sectional schematic view illustrating a light emitting device according to another embodiment of the invention.

FIG. 15 is a cross-sectional schematic view illustrating a light emitting device according to another embodiment of the invention. Referring to FIGS. 15 and 1C, a light emitting device 100*o* of this embodiment is similar to the light emitting device 100*a* of FIG. 1C, except that a thickness of a first wavelength converting unit layer 182*o*, a thickness of a third wavelength converting unit layer 184o and a thickness of a second wavelength converting unit layer 186o of a sheet-shaped wavelength converting layer 180o of this embodiment are different from each other. In addition, the thicknesses of the wavelength converting unit layers 182o, 184o, and 186o gradually increase in a direction away from the epitaxial structure E. For example, when the first wavelength converting unit layer 182o is a red light wavelength converting unit layer, and the second wavelength converting unit layer 186o is a green light wavelength converting unit layer, and the thickness of the first wavelength converting unit layer 182o is 0.2 to 0.4 times of the thickness of the second wavelength converting unit layer 186o, a usage of red phosphor powder having a higher cost may be reduced. In this way, an overall manufacturing cost of the light emitting device 100o may be effectively reduced.

Figure 16:
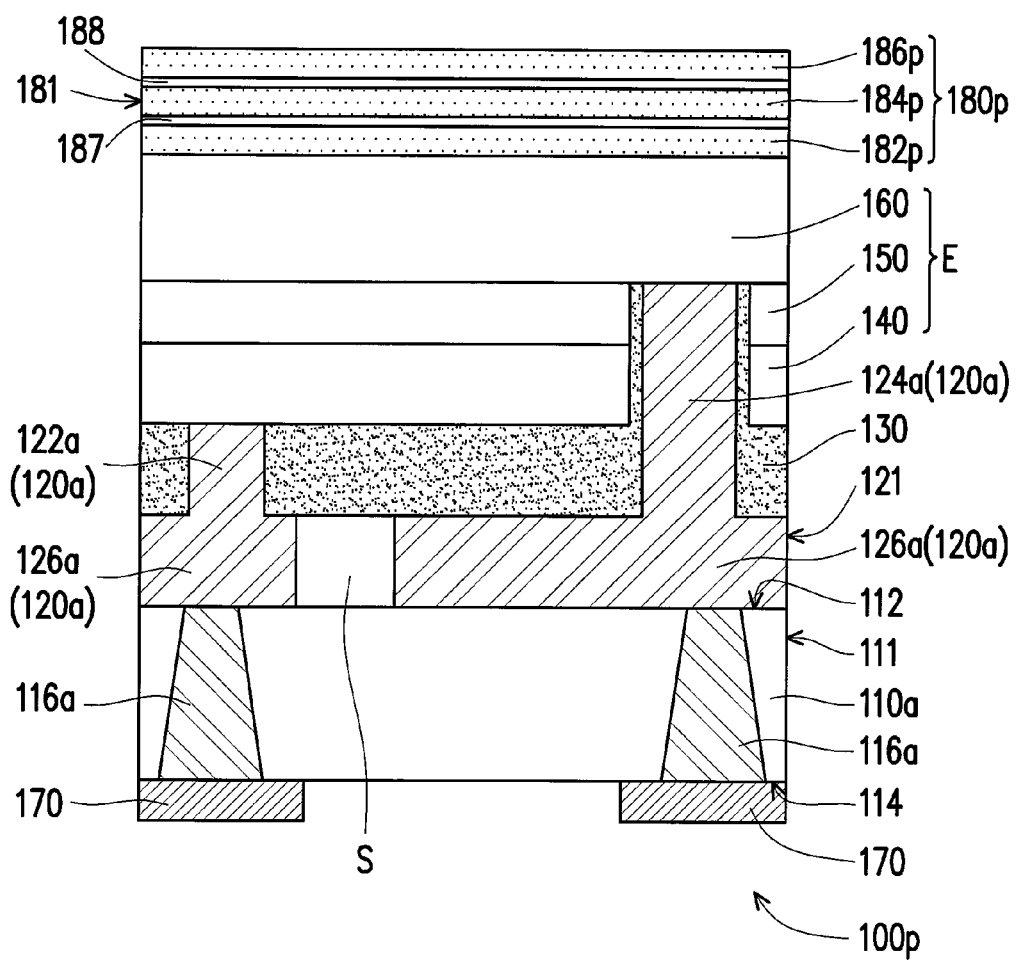
FIG. 16 is a cross-sectional schematic view illustrating a light emitting device according to another embodiment of the invention.

FIG. 16 is a cross-sectional schematic view illustrating a light emitting device according to another embodiment of the invention. Referring to FIGS. 16 and 1C together, a light emitting device 100p of this embodiment is similar to the light emitting device 100a of FIG. 1C, except that adhesive layers 187 and 188 are disposed between any two of a first wavelength converting unit layer 182p, a third wavelength converting unit layer 184p, and a second wavelength converting unit layer 186p of a sheet-shaped wavelength converting layer 180p of this embodiment. In addition, a thickness of the adhesive layers 187 and 188 may be 0.3 times to 0.7 times of the first wavelength converting unit layer 182p. Here, the adhesive layers 187 and 188 are disposed to reinforce an adhesive strength between the first wavelength converting unit layer 182p and the third wavelength converting unit layer 184p and between the third wavelength converting unit layer 184p and the second wavelength converting unit layer 186p, and adjust a surface tension thereof, such that surfaces of the first wavelength converting unit layer 182p, the second wavelength converting unit layer 186p, and the third wavelength converting unit layer 184p are planarized through stacking of the adhesive layers 187 and 188 and a surface roughness (Ra) is less than 5 micrometers. Of course, diffusive particles (not shown), reflective particles (not shown), scattering particles (not shown), or at least two of the aforesaid particles may be added in the adhesive layers 187 and 188, such that when the sheet-shaped wavelength converting layer 100p is adhered onto the epitaxial structure E, the light generated by the light emitting device may be scattered, reflected, and diffused. Thus, such configuration still falls within the scope claimed by the invention.

It should be noted that, in other embodiments not shown herein, the spaces 117f, 117g, and 117h of the conductive through vias 116f, 116g, and 116h, the optical coupling layers 190j, 190l, and 190m, the sheet-shaped wavelength converting layers 180a, 180o, and 180p, the substrates 110f, 110g, and 110h, the electrode connecting layer 120d, the ohmic contact layer 210, the reflecting layer 220, the insulating protection layer 230, the color mixing layer 240, and the electrode pads 172 mentioned in the previous embodiments may also be used. People skilled in the art may choose the aforesaid components based on the practical needs to achieve the desired technical effect with reference to the previous embodiments.

In view of the foregoing, the sheet-shaped wavelength converting layer of the invention at least includes the first wavelength converting unit layer and the second wavelength converting unit layer. In addition, the emission peak wavelength of the first wavelength converting unit layer is greater than the emission peak wavelength of the second wavelength converting unit layer, and the full width half magnitude of the second wavelength converting unit layer is greater than the full width half magnitude of the first wavelength converting unit layer. In such arrangement where the emission wavelengths are arranged from one with a longer wavelength to one with a shorter wavelength, since the energy of the emitted light of the first wavelength converting unit layer is lower, the emitted light of the first wavelength converting unit layer is not absorbed by the second wavelength converting unit layer. Moreover, since the full width magnitudes are arranged from one with a smaller full width magnitude to one with a greater full width magnitude, the wavelength of the emitted light of the first wavelength converting unit layer may be prevented from overlapping the absorbing wave band of the second wavelength converting unit layer. In this way, the light emitting device has a wider wave band coverage after light mixture, thereby having a more preferable light emitting efficiency and light rendering property. Furthermore, since the sheet-shaped wavelength converting layer is disposed on the epitaxial structure in the light emitting device of the invention, the sheet-shaped wavelength converting layer is implemented as a planar structure, and the edge of the sheet-shaped wavelength converting layer is substantially aligned to the edge of the substrate, the sheet-shaped wavelength converting layer of the invention has a thinner thickness and smaller volume as compared with the conventional light emitting diode device sealed a packaging gel. Thus, the light emitting device is miniaturized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting device, comprising:
    an epitaxial structure;
    a sheet-shaped wavelength converting layer, disposed on the epitaxial structure and at least comprising a first wavelength converting unit layer and a second wavelength converting unit layer, wherein the first wavelength converting unit layer is located between the second wavelength converting unit layer and the epitaxial structure, an emission peak wavelength of the first wavelength converting unit layer is greater than an emission peak wavelength of the second wavelength converting unit layer, and a full width half magnitude of the second wavelength converting unit layer is greater than a full width half magnitude of the first wavelength converting unit layer, wherein the first wavelength converting unit layer comprises a wavelength converting substance and a gel, the first wavelength converting unit layer is calculated based on total percentage of 100% of composition, the wavelength converting substance has a percentage by weight in a range from 60% to 95%, and a thickness of the first wavelength converting unit layer is in a range from 1.2 times to 3 times of a mean particle diameter of the wavelength converting substance; and
    an adhesive layer, disposed between the first wavelength converting unit layer and the second wavelength converting unit layer.

2. The light emitting device as claimed in claim 1, wherein the sheet-shaped wavelength converting layer further comprises: a third wavelength converting unit layer, disposed between the first wavelength converting unit layer and the second wavelength converting unit layer, wherein an emission peak wavelength of the third wavelength converting unit layer is smaller than the emission peak wavelength of the first wavelength converting unit layer, and the emission peak wavelength of the third wavelength converting unit layer is greater than the emission peak wavelength of the second wavelength converting unit layer.

3. The light emitting device as claimed in claim 2, wherein a full width half magnitude of the third wavelength converting unit layer is smaller than the full width half magnitude of the second wavelength converting unit layer, and the full width half magnitude of the third wavelength converting unit layer is greater than the full width half magnitude of the first wavelength converting unit layer.

4. The light emitting device as claimed in claim 1, wherein the thickness of the first wavelength converting unit layer is smaller than a thickness of the second wavelength converting unit layer.

5. The light emitting device as claimed in claim 1, wherein a thickness of the adhesive layer is in a range from 0.3 times to 0.7 times of the thickness of the first wavelength converting unit layer.

6. The light emitting device as claimed in claim 1, wherein a Shore Durometer Hardness of the sheet-shaped wavelength converting layer is in a range from Shore D 30 to Shore D 90.

7. The light emitting device as claimed in claim 1, further comprising:
a substrate, having an upper surface and a lower surface opposite to each other and having a plurality of conductive through vias penetrating the substrate and connecting the upper surface and the lower surface;
an electrode connecting layer, disposed on the upper surface of the substrate and electrically connected to the conductive through vias, wherein there is at least one space between each of the conductive through vias and the electrode connecting layer, the electrode connecting layer has a connecting layer, at least one first electrode, at least one second electrode, the first electrode and the second electrode are separated from each other and connected to the connecting layer, and the connecting layer has at least one buffer region exposing the upper surface of the substrate, and the epitaxial structure is disposed on the electrode connecting layer and electrically connected with the electrode connecting layer.

8. The light emitting device as claimed in claim 7, wherein an edge of the sheet-shaped wavelength converting layer is aligned with an edge of the substrate.

9. The light emitting device as claimed in claim 7, wherein an edge of the electrode connecting layer is aligned with an edge of the substrate.

10. The light emitting device as claimed in claim 1, wherein the epitaxial structure has a rough surface, and there are micrometer-level voids between the rough surface and the sheet-shaped wavelength converting layer.

11. The light emitting device as claimed in claim 1, further comprising:
an optical coupling layer, disposed between the sheet-shaped wavelength converting layer and the epitaxial structure, wherein the optical coupling layer has a rough surface, and there are micrometer-level voids between the rough surface and the sheet-shaped wavelength converting layer or/and between the rough surface and the epitaxial structure.

12. The light emitting device as claimed in claim 1, further comprising:
a color mixing layer, disposed on the sheet-shaped wavelength converting layer, wherein an edge of the color mixing layer is aligned with an edge of the sheet-shaped wavelength converting layer, and a thickness of the color mixing layer is in a range from three times to six times of the thickness of the first wavelength converting unit layer.

13. The light emitting device as claimed in claim 7, further comprising:
an insulating layer, disposed on the electrode connecting layer and insulating the first electrode and the second electrode, wherein the epitaxial structure comprises:
a first type semiconductor layer, disposed on the insulating layer, wherein the first electrode penetrates the insulating layer to be electrically connected with the first type semiconductor layer;
a light emitting layer, disposed on the first type semiconductor layer; and
a second type semiconductor layer, disposed on the light emitting layer, wherein the second electrode penetrates the insulating layer, the first type semiconductor layer, and the light emitting layer to be electrically connected with the second type semiconductor layer.

14. The light emitting device as claimed in claim 13, further comprising:
an insulating protection layer, covering an edge of the first type semiconductor layer, an edge of the light emitting layer, and an edge of the second type semiconductor layer, wherein an edge of the the insulating protection layer is aligned with an edge of the substrate.

15. The light emitting device as claimed in claim 7, further comprising:
a plurality of electrode pads, disposed on the upper surface of the substrate and connected to the conductive through vias and the electrode connecting layer, wherein an orthogonal projection of the electrode pads on the substrate completely overlaps an orthogonal projection of the connecting layer on the substrate and projection areas thereof are the same.

16. The light emitting device as claimed in claim 15, further comprising:
a plurality of pads, disposed on the lower surface of the substrate and connected to the conductive through vias, wherein a distance between the pads is greater than a distance between the electrode pads.

17. A light emitting device, comprising:
an epitaxial structure; and
a sheet-shaped wavelength converting layer, disposed on the epitaxial structure and at least comprising a first wavelength converting unit layer and a second wavelength converting unit layer, wherein the first wavelength converting unit layer is located between the second wavelength converting unit layer and the epitaxial structure, an emission peak wavelength of the first wavelength converting unit layer is greater than an emission peak wavelength of the second wavelength converting unit layer, and a full width half magnitude of the second wavelength converting unit layer is greater than a full width half magnitude of the first wavelength converting unit layer, wherein the first wavelength converting unit layer comprises a wavelength converting substance and a gel, the first wavelength converting unit layer is calculated based on total percentage of 100% of composition, the wavelength converting substance has a percentage by weight in a range from 60% to 95%, and a thickness of the first wavelength converting unit layer is in a range from 1.2 times to 3 times of a mean particle diameter of the wavelength converting substance.

* * * * *